(12) United States Patent
Tarnowski et al.

(10) Patent No.: US 9,873,276 B2
(45) Date of Patent: Jan. 23, 2018

(54) MICROCONTACT PRINTING STAMPS WITH FUNCTIONAL FEATURES

(71) Applicant: 3M INNOVATIVE PROPERTIES COMPANY, St. Paul, MN (US)

(72) Inventors: Catherine P. Tarnowski, Mahtomedi, MN (US); David A. Johnson, Woodbury, MN (US); Roger W. Barton, Afton, MN (US); Larry L. Johnson, Hudson, WI (US); Jonathan J. O'Hare, Oakdale, MN (US); Tyler J. Rattray, Minneapolis, MN (US); Daniel M. Lentz, Cottage Grove, MN (US); Jeffrey H. Tokie, Scandia, MN (US); Matthew H. Frey, Cottage Grove, MN (US); Mikhail L. Pekurovsky, Bloomington, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/033,672

(22) PCT Filed: Oct. 30, 2014

(86) PCT No.: PCT/US2014/063133
§ 371 (c)(1),
(2) Date: May 2, 2016

(87) PCT Pub. No.: WO2015/069538
PCT Pub. Date: May 14, 2015

(65) Prior Publication Data
US 2016/0250875 A1   Sep. 1, 2016

Related U.S. Application Data

(60) Provisional application No. 61/900,923, filed on Nov. 6, 2013.

(51) Int. Cl.
*B41K 1/38* (2006.01)
*G06F 3/041* (2006.01)
(Continued)

(52) U.S. Cl.
CPC ............... *B41K 1/38* (2013.01); *B41D 7/00* (2013.01); *B41K 3/44* (2013.01); *G03F 7/0002* (2013.01);
(Continued)

(58) Field of Classification Search
CPC . G06F 3/041; G06F 3/044; B41K 1/38; G03F 7/0002
See application file for complete search history.

(56) References Cited

U.S. PATENT DOCUMENTS 5,079,600 A   1/1992   Schnur
5,512,131 A   4/1996   Kumar
(Continued)

FOREIGN PATENT DOCUMENTS

CN   1905016 A   1/2007
CN   103226214 A   7/2013
(Continued)

OTHER PUBLICATIONS

Libioulle, "Contact-Inking Stamps for Microcontact Printing of Alkanethiols on Gold", Langmuir, 1999, vol. 15, No. 2, pp. 300-304.
(Continued)

*Primary Examiner* — Lixi C Simpson
(74) *Attorney, Agent, or Firm* — James A. Baker

(57) ABSTRACT

A method includes providing an elastomeric stamp including a stamping surface with a first pattern element having a fill factor of 20 to 99 percent and including a continuous region and at least one discontinuous region, the discontinuous region including at least one of: (1) one or more
(Continued)

elongated concavities, and (2) one or more interior voids. A second pattern element of the stamping surface has a fill factor of 0.25 to 10 percent, and includes traces with a width from 0.1 micrometers to 50 micrometers. The stamping surface is inked with an ink composition including a functionalizing molecule with a functional group selected to bind to a surface of the ink-receptive material. The inked stamping surface is contacted with an ink-receptive material selected from a sheet or a web for a contact time sufficient to bind the functional group with the surface of the ink-receptive material to form a self-assembled monolayer (SAM) of the functionalizing material.

20 Claims, 19 Drawing Sheets

(51) Int. Cl.
    B41D 7/00     (2006.01)
    G03F 7/00     (2006.01)
    H05K 3/12     (2006.01)
    B41K 3/44     (2006.01)

(52) U.S. Cl.
    CPC ........... *G06F 3/041* (2013.01); *H05K 3/1275* (2013.01); *G06F 2203/04112* (2013.01); *H05K 2203/0143* (2013.01)

(56) References Cited

U.S. PATENT DOCUMENTS

| | | |
|---|---|---|
| 2003/0047535 A1 | 3/2003 | Schueller |
| 2007/0148599 A1* | 6/2007 | True .................... G01N 33/532 430/311 |
| 2008/0150148 A1 | 6/2008 | Frey |
| 2008/0171182 A1 | 7/2008 | Kawate |
| 2009/0218310 A1* | 9/2009 | Zu .......................... B82Y 10/00 216/11 |
| 2010/0252955 A1* | 10/2010 | Agarwal ................ B82Y 10/00 264/293 |
| 2010/0258968 A1 | 10/2010 | Zu |
| 2011/0126730 A1 | 6/2011 | Berniard |
| 2013/0068723 A1* | 3/2013 | Stay ................... B41M 5/38207 216/41 |
| 2013/0277330 A1 | 10/2013 | Zu |

FOREIGN PATENT DOCUMENTS

| | | |
|---|---|---|
| WO | WO 2009-143206 | 11/2009 |
| WO | WO 2010-151471 | 12/2010 |
| WO | WO 2013-003253 | 1/2013 |
| WO | WO 2013-003412 | 1/2013 |
| WO | WO 2013-040319 | 3/2013 |
| WO | WO 2014-088950 | 6/2014 |

OTHER PUBLICATIONS

Love, "Self-Assembled Monolayers of Thiolates on Metals as a Form of Nanotechnology", Chemical Reviews, Mar. 25, 2005, vol. 105, No. 4, pp. 1103-1170.

Ulman, "Formation and Structure of Self-Assembled Monolayers", Chemical Reviews, 1996, vol. 96, No. 4, pp. 1533-1554.

International Search Report for PCT International Application No. PCT/US2014/063133 dated Feb. 17, 2015, 3 pages.

* cited by examiner

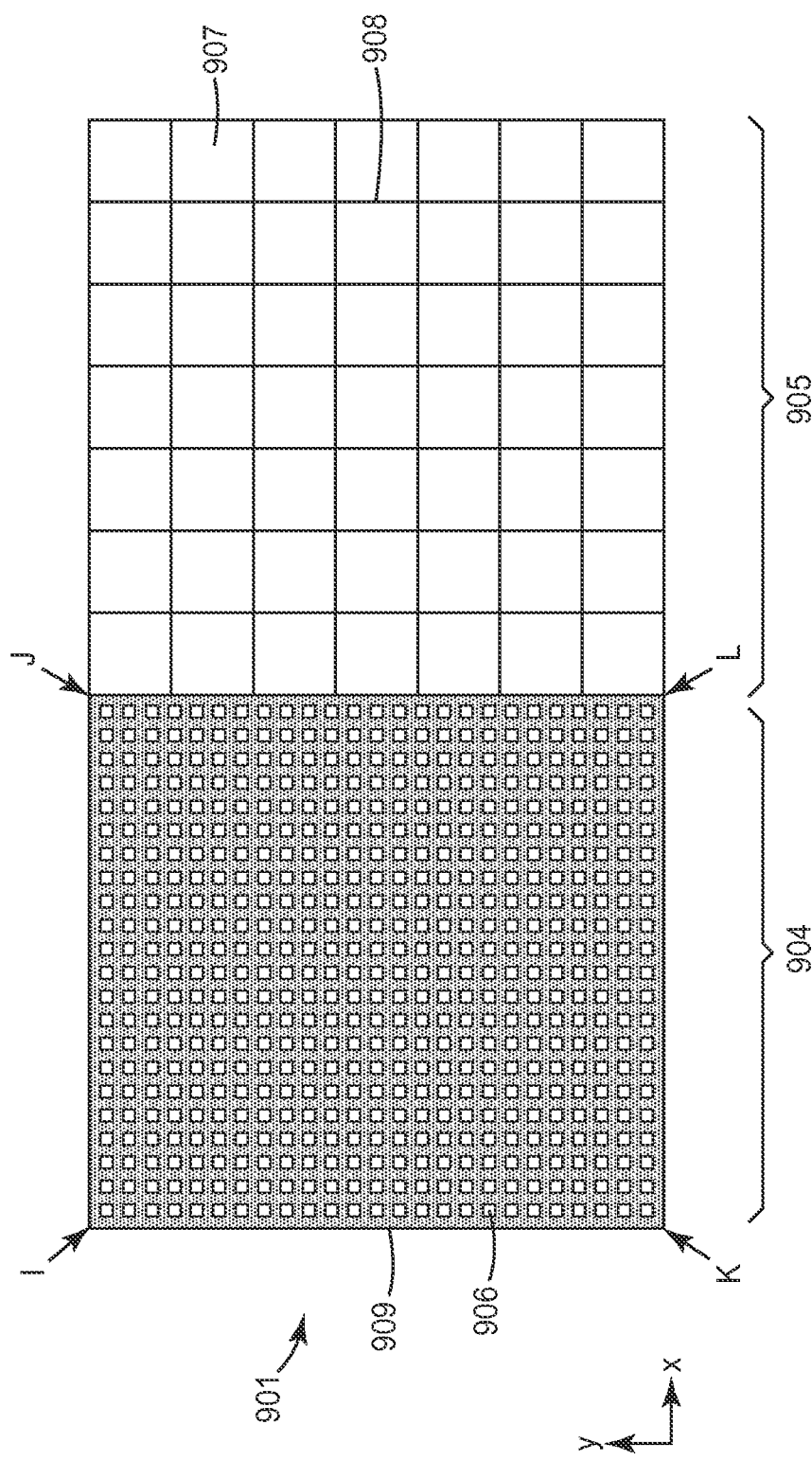

MICROCONTACT PRINTING STAMPS WITH FUNCTIONAL FEATURES

BACKGROUND

Microcontact printing can be used, for example, to generate patterns of functionalizing molecules on a surface of a substrate. The functionalizing molecules include a functional group that attaches to a substrate surface or a coated substrate surface via a chemical bond to form a patterned self-assembled monolayer (SAM). The SAM is a single layer of molecules attached by a chemical bond to a surface and that have adopted a preferred orientation with respect to that surface and even with respect to each other.

A basic method for microcontact printing SAMs involves applying an ink containing the functionalizing molecules to a relief-patterned elastomeric stamp (for example, a poly(dimethylsiloxane) (PDMS) stamp) and then contacting the inked stamp to a substrate surface, usually a metal or metal oxide surface, so that SAMs form in the regions of contact between the stamp and the substrate.

In a manufacturing process the functionalizing molecules should be reproducibly transferred from the stamp to the substrate surface in a desired high-resolution patterned SAM with a minimum number of defects. As microcontact printing speeds increase in roll-to-roll manufacturing processes on a moving web of material, pattern defects such as line blurring and voids should be minimized to ensure accurate SAM pattern resolution and reproducibility. Since the SAM patterns being generated are often very small, any relative movement between the ink laden stamp and the substrate, once contact is made, can introduce inaccuracy, distortion, or double images in the resulting printed pattern. Consistent and low contact pressure between the stamp and the substrate can reduce distortion of the small features on the surface of the stamp, and can lessen the likelihood that the thin lines on the stamp's surface are compressed or collapsed. Accurate SAM pattern transfer can allow for accurate etch patterning of the substrate, when the SAM is used as an etch mask.

SUMMARY

In one aspect, the present disclosure is directed to modified pattern elements on a microcontact printing stamp that can bleed away air entrained at the interface between the pattern element and a substrate in a printing process. The modified pattern elements can include channels in the form of elongated concavities for air to escape, or interior patterned voids that allow space for air to collect, without causing a defect in the pattern printed on the substrate. In another aspect, the present disclosure is directed to traction features that may be included on a microcontact printing stamp to enhance the consistency of the contact density between the stamp and the substrate. In yet another aspect, the present disclosure is directed to electrical assemblies that include electrically conductive patterns according to the modified pattern elements of the stamp. In some embodiments, the modified pattern elements can be electrically connected to a conductor of a second substrate.

Listing of Embodiments

A. A method including:
providing an elastomeric stamp including a base surface and a stamping surface extending away from the base surface, the stamping surface including at least one first pattern element and at least one second pattern element, and wherein:
the first pattern element of the stamping surface has a fill factor of 20 to 99 percent, and the first pattern element of the stamping surface includes a continuous region and at least one discontinuous region including at least one of: (1) one or more elongated concavities, and (2) one or more interior voids; and
the second pattern element of the stamping surface has a fill factor of 0.25 to 10 percent, and the second pattern element of the stamping surface includes traces with a width from 0.1 micrometers to 50 micrometers;
inking the stamping surface with an ink composition including a functionalizing molecule with a functional group selected to bind to a surface of the ink-receptive material; and
contacting the inked stamping surface with a major surface of the ink-receptive material selected from a sheet or a web for a contact time sufficient to bind the functional group with the surface of the ink-receptive material to form a self-assembled monolayer (SAM) of the functionalizing material thereon.

B. The method of embodiment A, wherein the stamping surface includes one or more elongated concavities in the first pattern element, and wherein each elongated concavity has an aspect ratio of 2 to 100.

C. The method of embodiment A, wherein the stamping surface includes one or more elongated concavities in the first pattern element, and wherein each elongated concavity has an aspect ratio of 5 to 50.

D. The method of embodiment A, wherein the stamping surface includes one or more elongated concavities in the first pattern element, and wherein each elongated concavity has an aspect ratio of 10 to 20.

E. The method of any one of embodiments A-D, wherein the stamping surface includes one or more interior voids in the first pattern element, and wherein the interior voids are elongate.

F. The method of any one of embodiments A-D, wherein the stamping surface includes one or more interior voids in the first pattern element, and wherein the interior voids are branched.

G. The method of any one of embodiments A-F, wherein the first pattern element in the stamping surface includes both elongated concavities and interior voids.

H. The method of any one of embodiments A-F, wherein the interior voids in the first pattern element in the first stamping surface form a mesh.

I. The method of any one of embodiments A-H, wherein the elongated concavities in the first pattern element are oriented at an angle with respect to a direction of movement of a contact front between the stamp and the surface of the web material.

J. The method of embodiment I, wherein the angle is 30° to 60°.

K. The method of embodiment J, wherein the angle is 45°.

L. The method of any one of embodiments A-K, wherein the elongated concavities or the interior voids form an X-shaped pattern.

M. The method of any one of embodiments A-L, wherein the depth of the elongated concavities or the interior voids extends to the base surface of the stamp.

N. The method of any one of embodiments A-L, wherein the fill factor of the first pattern element is 22.5%-95%.

O. The method of any one of claims A-L, wherein the fill factor of the first pattern element is 25%-80%.

P. The method of any one of embodiments A-O, wherein the first pattern element has an area of 1 mm² to 10 mm².

Q. The method of any one of embodiments A-P, wherein the second pattern element has a fill factor of 0.5% to 5%.

R. The method of any one of embodiments A-Q, wherein the second pattern element has an area of 10 cm² to 5000 cm².

S. The method of any one of embodiments A-R, wherein the second pattern element includes a mesh.

T. The method of embodiment S, wherein the mesh includes a plurality of traces, and wherein each trace has a width of 0.5 to 10 micrometers.

U. The method of any one of embodiments A-T, wherein the first pattern element and the second pattern element share a boundary.

V. The method of any of embodiments A-T, wherein the first pattern element and the second pattern element are connected by at least one trace.

W. The method of any one of embodiments A-V, wherein the contact time is less than about 10 seconds.

X. The method of any one of embodiments A-W, wherein the thickness of the SAM on the surface of the ink-receptive material is less than about 50 Å.

Y. The method of any one of embodiments A-X, wherein the stamping surface includes a poly(dimethylsiloxane), and wherein the functionalizing molecule is an organosulfur compound selected from at least one of alkyl thiols and aryl thiols.

Z. The method of any one of embodiments A-Y, wherein the major surface of the ink-receptive material is selected from the group consisting of metals, polymeric films, glass, ceramic and composites.

AA. The method of any one of claims A-Z, wherein the ink-receptive material is a web material that is unwound from a support.

BB. The method of embodiment AA, wherein the web material is tensioned between a first support roll and a second support roll, and wherein the tension in the web material between the first support roll and the second support roll is between about 0.5 pounds per lineal inch and 10 pounds per lineal inch.

CC. The method of any one of embodiments A-BB, wherein the surface of the ink-receptive material includes SAM-free areas, and the method further includes etching the SAM-free areas.

DD. The method of any one of embodiments A-CC, wherein the stamp is mounted on a rotating element, wherein the rotation of the rotating element is supported by at least one air bearing.

EE. The method of any one of embodiments A-DD, further including removing the stamping surface from the major surface of the ink-receptive material.

FF. An elastomeric microcontact printing stamp including a base surface and a stamping surface extending away from the base surface, the stamping surface including:
at least one first pattern element with a fill factor of 20 to 99 percent, wherein the first pattern element of the stamping surface includes a continuous region and at least one discontinuous region, the discontinuous region including at least one of: (1) one or more elongated concavities, and (2) one or more interior voids; and at least one second pattern element with a fill factor of 0.25 to 10 percent, and wherein the second pattern element of the stamping surface includes a plurality of traces, wherein each trace has a width from 0.1 micrometers to 50 micrometers;
wherein the stamping surface has disposed thereon an ink including a plurality of functionalizing molecules including at least one functional group selected to bind to a substrate and form a self-assembled monolayer (SAM) of the functionalizing molecules on the substrate.

GG. The stamp of embodiment FF, wherein the stamping surface includes one or more elongated concavities in the first pattern element, and wherein each elongated concavity has an aspect ratio of 2 to 100.

HH. The stamp of embodiment FF, wherein the stamping surface includes one or more elongated concavities in the first pattern element, and wherein each elongated concavity has an aspect ratio of 5 to 50.

II. The stamp of embodiment FF, wherein the stamping surface includes one or more elongated concavities in the first pattern element, and wherein each elongated concavity has an aspect ratio of 10 to 20.

JJ. The stamp of any one of embodiments FF-II, wherein the stamping surface includes one or more interior voids in the first pattern element, and wherein the interior voids are elongate.

KK. The stamp of any one of embodiments FF-JJ, wherein the stamping surface includes one or more interior voids in the first pattern element, and wherein the interior voids are branched.

LL. The stamp of any one of embodiments FF-KK, wherein the first pattern element in the stamping surface includes both elongated concavities and interior voids.

MM. The stamp of any one of embodiments FF-LL, wherein the interior voids in the first pattern element in the first stamping surface form a mesh.

NN. The stamp of any one of embodiments FF-MM, wherein the fill factor of the first pattern element is 22.5%-95%.

OO. The stamp of any one of embodiments FF-NN, wherein the fill factor of the first pattern element is 25%-80%.

PP. The stamp of any one of embodiments FF-OO, wherein the first pattern element has an area of 1 mm² to 10 mm².

QQ. The stamp of any one of embodiments FF-PP, wherein the second pattern element has a fill factor of 0.5% to 5%.

RR. The stamp of any one of embodiments FF-QQ, wherein the second pattern element has an area of 10 cm² to 5000 cm².

SS. The stamp of any one of embodiments FF-RR, wherein the second pattern element includes a mesh.

TT. The stamp of embodiment SS, wherein the mesh includes a plurality of traces, wherein each trace has a width of 0.5 to 10 micrometers.

UU. The stamp of any one of embodiments FF-TT, wherein the first pattern element and the second pattern element are contiguous.

VV. An electrically conductive pattern disposed on a visible light transparent substrate, the pattern including:
at least one first pattern element including a fill factor of 20 to 99 percent, wherein the first pattern element includes a continuous region and at least one discontinuous region, the discontinuous region including at least one of: (1) one or more elongated concavities, and (2) one or more interior voids; and
at least one second pattern element electrically connected to the first pattern element, wherein the second pattern element has a fill factor of 0.25 to 10 percent, and wherein the second pattern element further includes traces, and wherein each trace has width from 0.1 micrometers to 50 micrometers.

WW. The electrically conductive pattern of embodiment VV, wherein the stamping surface includes one or more elongated concavities in the first pattern element, and wherein each elongated concavity has an aspect ratio of 2 to 100.

XX. The electrically conductive pattern of embodiment VV, wherein the stamping surface includes one or more elongated concavities in the first pattern element, and wherein each elongated concavity has an aspect ratio of 5 to 50.

YY. The electrically conductive pattern of embodiment VV, wherein the stamping surface includes one or more elongated concavities in the first pattern element, and wherein each elongated concavity has an aspect ratio of 10 to 20.

ZZ. The electrically conductive pattern of any one of embodiments VV-YY, wherein the stamping surface includes one or more interior voids in the first pattern element, and wherein the interior voids are elongate.

AAA. The electrically conductive pattern of any one of embodiments VV-ZZ, wherein the stamping surface includes one or more interior voids in the first pattern element, and wherein the interior voids are branched.

BBB. The electrically conductive pattern of any one of embodiments VV-AAA, wherein the first pattern element in the stamping surface includes both elongated concavities and interior voids.

CCC. The electrically conductive pattern of any one of embodiments VV-BBB, wherein the interior voids in the first pattern element in the first stamping surface form a mesh.

DDD. The electrically conductive pattern of any one of embodiments VV-CCC, wherein the fill factor of the first pattern element is 22.5%-95%.

EEE. The electrically conductive pattern of any one of embodiments VV-CCC, wherein the fill factor of the first pattern element is 25%-80%.

FFF. The electrically conductive pattern of any one of embodiments VV-EEE, wherein the first pattern element has an area of 1 mm$^2$ to 10 mm$^2$.

GGG. The electrically conductive pattern of any one of embodiments VV-FFF, wherein the second pattern element has a fill factor of 0.5% to 5%.

HHH. The electrically conductive pattern of any one of embodiments VV-GGG, wherein the second pattern element has an area of 10 cm$^2$ to 5000 cm$^2$.

III. The electrically conductive pattern of any one of embodiments VV-HHH, wherein the second pattern element includes a mesh.

JJJ. The electrically conductive pattern of embodiment III, wherein the mesh includes a plurality of traces, and wherein each trace has a width of 0.5 micrometers to 10 micrometers.

KKK. The electrically conductive pattern of any one of embodiments VV-JJJ, wherein the conductive pattern is electrically connected to a second substrate at the first pattern element.

LLL. A touch screen sensor including a visible light transparent substrate having disposed thereon the electrically conductive pattern of any one of embodiments VV-KKK.

MMM. A method including:
tensioning a web material between two support rollers at a tension up to about 10 pounds per lineal inch;
mounting a poly(dimethylsiloxane) stamp on a surface of a roller supported by an air bearing, wherein the stamp includes a base surface and a stamping surface extending away from the base surface, the stamping surface including an arrangement of pattern elements, the pattern elements including:
at least one first pattern element with a fill factor of 20 to 99 percent, wherein the first pattern element includes a continuous region and at least one discontinuous region, the discontinuous region including at least one of: (1) one or more elongated concavities; and (2) one or more interior voids; and
at least one second pattern element contiguous with the first pattern element and having a fill factor of 0.25 to 10 percent, wherein the second pattern element includes a plurality of elongated traces, and wherein each trace has a width of 0.1 micrometers to 50 micrometers;
inking the stamping surface with an ink composition including an organosulfur compound;
contacting the inked stamping surface with a major surface of the web material for a contact time sufficient for a thiol functional group on the organosulfur compound to bind to an ink-receptive surface of the web material to provide a self-assembled monolayer (SAM) of the organosulfur compound thereon according to the arrangement of pattern elements on the stamping surface; and
removing the stamping surface from the major surface of the web material.

NNN. The method of embodiment MMM, wherein the web material moves at a speed of 10 feet per minute to 100 feet per minute.

OOO. The method of any one of embodiments MMM-NNN, wherein the web material moves continuously between the support rollers.

PPP. The method of any one of embodiments MMM-OOO, wherein the web material is selected from the group consisting of metals, polymeric films, glass, ceramics and composites.

QQQ. A roll of web material having a down web direction and a cross web direction, the web material including an electrically conductive pattern disposed thereon, the pattern including an arrangement of spaced-apart functional pattern elements, wherein the functional pattern elements forming the pattern have a fill factor of 20 to 100 percent and are arranged in the down-web direction; and at least one non-functional pattern element having fill factor of 20 to 100 percent interposed between each of the spaced apart functional pattern elements.

RRR. The material of embodiment QQQ, wherein the pattern density, for 0.5 mm sections taken along the arrangement of functional elements and non-functional elements in the downweb direction, does not vary by more than 50 percent from an average pattern density for the pattern.

SSS. The material of embodiment QQQ, wherein the pattern density, for 0.25 mm sections taken along the arrangement of functional elements and non-functional elements in the downweb direction, does not vary by more than 25 percent from an average pattern density for the pattern.

TTT. The material of embodiment QQQ, wherein the functional pattern elements comprise the electrically conductive pattern of any one of embodiments VV-LLL.

The terms "about" or "approximately" with reference to a numerical value, property, or characteristic, means +/−five percent of the numerical value, property, characteristic, but also expressly includes any narrow range within the +/−five percent of the numerical value or property or characteristic as well as the exact numerical value. For example, a temperature of "about" 100° C. refers to a temperature from 95° C. to 105° C., inclusive, but also expressly includes any narrower range of temperature or even a single temperature within that range, including, for example, a temperature of exactly 100° C.

The term "substantially" with reference to a property or characteristic means that the property or characteristic is exhibited to within 98% of that property or characteristic, but also expressly includes any narrow range within the two percent of the property or characteristic, as well as the exact value of the property or characteristic. For example, a substrate that is "substantially" transparent refers to a substrate that transmits 98-100%, inclusive, of the incident light.

The term "continuous" means lacking a break or an interruption.

The term "discontinuous" means having interruptions or gaps.

The term "contiguous" means touching or connected throughout in an unbroken sequence.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 3A-D are schematic overhead views of embodiments of stamps suitable for use in a microcontact printing process, each stamp including a high density modified pattern element and a low pattern density region.

Like symbols in the figures indicate like elements.

DETAILED DESCRIPTION

Figure 1:
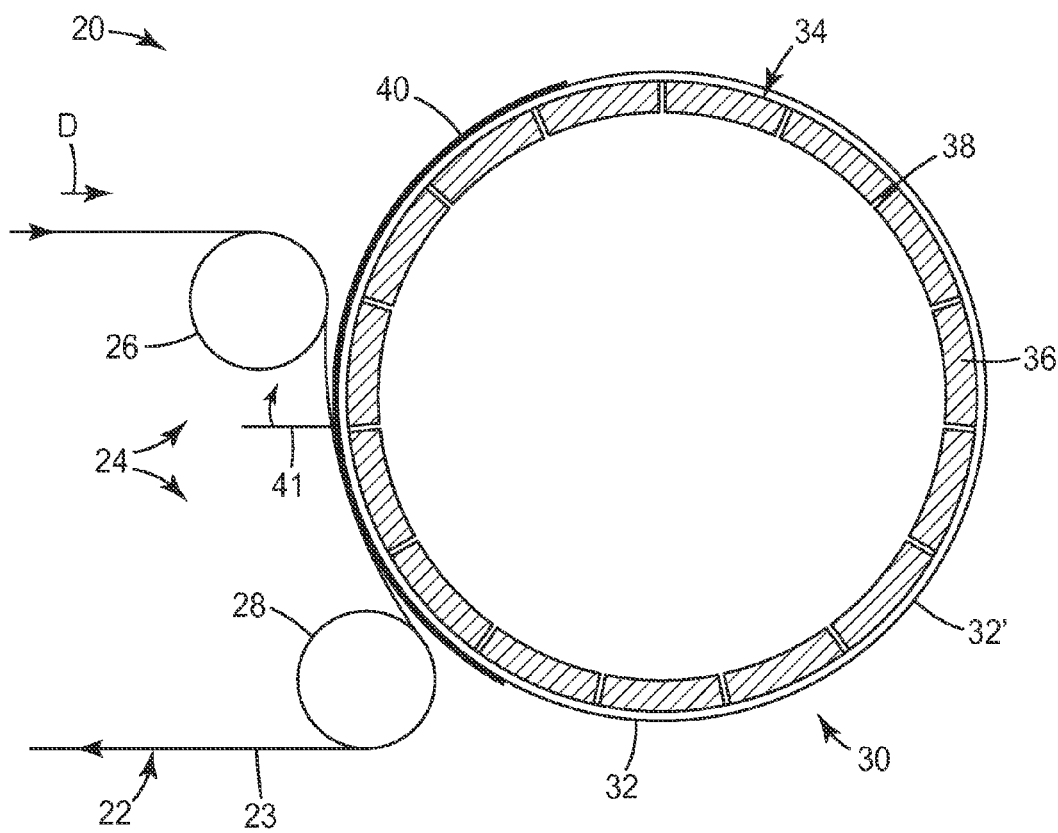
FIG. 1 is a schematic cross-sectional view of an embodiment of a system for carrying out a microcontact printing process.

FIG. 1 is a schematic view of an embodiment of a microcontact printing system 20 in which a web of material 22 of indefinite length is conveyed in direction D along a web path 24. In some embodiments, the web 22 may be a polymeric material such as polyethylene terephthalate (PET), polyethylene naphthalate (PEN), cyclic olefin polymer (COP), cyclic olefin copolymer (COC), polycarbonate, and polyimide. In some embodiments, such substrates might conveniently be coated with a thin metal layer such as silver, gold, copper, palladium, or the like.

In the embodiment of FIG. 1, the web path 24 includes an entry roller 26 and an exit roller 28 positioned such that the web 22 touches or wraps at least a portion of stamp roll assembly 30. In some embodiments, one or both of the entry roller 26 and the exit roller 28 are idle rollers. Web path 24 conveys the free span of web 22 between entry roller 26 and exit roller 28 into touching contact with stamp roll assembly 30. Stamp roll assembly 30 includes a roll 32 having a very low drag. Web transport direction D and the synchronized counterclockwise rotation of stamp 40 and roll 32 lead to propagation of a contact front 41 between the web 22 and stamp 40. The propagation direction of the contact front 41, relative to the stamp frame of reference, is clockwise in FIG. 1.

In the embodiment illustrated in FIG. 1, the very low drag of roll 32 is provided in one embodiment by mounting sleeve 32' on an air bearing 34. Sleeves can be built out of metals, combination of layers of metals, from composite materials that include PAN carbon fibers, pitch carbon fibers, para-aramid fibers, Kevlar fibers, and glass fibers, or from combination of layers of metals and polymeric materials, for example elastomers like rubbers. These fiber-based materials are impregnated with polymeric materials that could include epoxies, polyesters, and vinylesters. Examples of metals suitable for building sleeves include nickel, copper, nickel/cobalt, titanium, and aluminum. A thin shell of carbon composite can also be suitable for use as a sleeve.

In one embodiment air bearing 34 can include a non-rotating steel core 36 having apertures 38 for the egress of an airflow that rotationally supports roll 32. Heaters or coolers may be placed in or adjacent to the core 36 or the air supply to add or remove heat from roll 32 if desired to control the temperature of the micro-contact printing stamp. In micro-contact printing applications, it is desirable to have conformability of contact between the micro-contact printing stamp and the printing surface. Conformability is needed to compensate for non-uniformity of the substrate's thickness, the micro-contact printing stamp's thickness and the roll's run-out. Typical methods for achieving conformability in micro-contact printing includes building stamps out of elastomeric materials, inserting layers of deformable foam or low modulus polymers between the micro-contact printing stamp and the mounting surface. In an air bearing, conformability can be controlled by the air gap distance between the opposed bearing surfaces as well as by the air flow. In some embodiments, a foam layer is no longer needed when mounting the micro-contact printing stamp to the roll or sleeve supported by one or more air bearings.

A microcontact printing stamp 40 is mounted on roll 32, and may cover all or only part of its circumference. Useful materials for forming the stamp 40 include elastomeric polymers such as, for example, silicones, polyurethanes, ethylene propylene diene M-class (EPDM) rubbers, as well as commercially available flexographic printing plate materials (for example, those commercially available from E. I. du Pont de Nemours and Company, Wilmington, Del., under the trade designation Cyrel). The stamp can be made from a composite material including, for example, an elastomeric material on the stamping surfaces combined with a woven or non-woven fibrous reinforcement layer. Polydimethylsiloxane (PDMS) is particularly useful as a stamp material, as it is elastomeric and has a low surface energy (which makes it easy to remove the stamp from most substrates). A useful commercially available formulation is available from Dow Corning, Midland, Mich., under the trade designation Sylgard 184 PDMS.

Microcontact printing stamps can be made by a number of methods that include: casting against masters, selective curing by actinic radiation or heat, surface machining, or laser ablation. For example, PDMS stamps can be formed by dispensing an un-crosslinked PDMS polymer into or against a patterned mold, followed by curing. The master tool for molding the elastomeric stamps can be formed using photolithography techniques known in the art. The elastomeric stamp can be molded against the master tool by applying uncured PDMS to the master tool and then curing.

The microcontact printing stamp 40 has applied thereon or therein a material, referred to herein as an ink, which includes functionalizing molecules with a functional group selected to bind to a surface 23 of the web material 22. Preferred combinations of materials 22 and functional groups for functionalizing molecules in the ink include, but are not limited to: (1) metals such as gold, silver, copper, cadmium, zinc, palladium, platinum, mercury, lead, iron, chromium, manganese, tungsten, and any alloys of the above with sulfur-containing functional groups such as thiols, sulfides, disulfides, and the like; (2) doped or undoped silicon with alkenes; (3) metal oxides such as silica, alumina, quartz, glass, and the like with silanes, chlorosilanes, and carboxylic acids; (4) platinum and palladium with nitriles and isonitriles; and (4) copper with hydroxamic acids. Additional suitable functional groups on the functionalizing molecules in the ink include acid chlorides, anhydrides, sulfonyl groups, phosphoryl groups, hydroxyl groups and amino acid groups. Additional surface materials 22 include germanium, gallium, arsenic, and gallium arsenide. Additionally, epoxy compounds, polysulfone compounds, plastics and other polymers may find use as the material 22. Additional materials and functional groups can be found in U.S. Pat. Nos. 5,079,600 and 5,512,131.

In some embodiments, the functionalizing molecules utilized to form SAMs in the presently-described process are delivered to the stamp 40 as ink solutions including one or more organosulfur compounds as described in U.S. Published Application No. 2010/0258968. Each organosulfur compound is preferably a thiol compound capable of forming a SAM on a selected surface 23 of a web material 22. The thiols include the —SH functional group, and can also be called mercaptans. The thiol group is useful for creating a chemical bond between molecules of the functionalizing compound in the ink and the surface 23 of a metal. Useful thiols include, but are not limited to, alkyl thiols and aryl thiols. Other useful organosulfur compounds include dialkyl disulfides, dialkyl sulfides, alkyl xanthates, dithiophosphates, and dialkylthiocarbamates.

Preferably the ink solution includes alkyl thiols such as, for example, linear alkyl thiols: $HS(CH_2)_nX$, wherein n is the number of methylene units and X is the end group of the alkyl chain (for example, $X=$—$CH_3$, —OH, —COOH, —$NH_2$, or the like). Preferably, $X=$—$CH_3$. Other useful functional groups include those described, for example, in: (1) Ulman, "Formation and Structure of Self-Assembled Monolayers," Chemical Reviews Vol. 96, pp. 1533-1554 (1996); and (2) Love et al., "Self-Assembled Monolayers of Thiolates on Metals as a Form of Nanotechnology," Chemical Reviews Vol. 105, pp. 1103-1169 (2005).

Useful alkyl thiols can be linear alkyl thiols (that is, straight chain alkyl thiols) or branched, and can be substituted or unsubstituted. The optional substituents preferably do not interfere with the formation of a SAM. Examples of branched alkyl thiols that are useful include alkyl thiols with a methyl group attached to every third or every fourth carbon atom of a linear alkyl chain backbone (for example, phytanylthiol). Examples of mid-chain substituents within useful alkyl thiols include ether groups and aromatic rings. Useful thiols can also include three-dimensional cyclic compounds (for example, 1-adamantanethiol).

Preferred linear alkyl thiols have 10 to 20 carbon atoms (more preferably, 12 to 20 carbon atoms; most preferably 16 carbon atoms, 18 carbon atoms, or 20 carbon atoms).

Suitable alkyl thiols include commercially available alkyl thiols (Aldrich Chemical Company, Milwaukee, Wis.). Preferably, the ink solutions 20 consist primarily of a solvent and the organosulfur compound, with impurities including less than about 5% by weight of the ink solution; more preferably less than about 1%; even more preferably less than about 0.1%. Useful inks 20 can contain mixtures of different organosulfur compounds dissolved in a common solvent such as, for example, mixtures of alkyl thiol and dialkyl disulfide.

Aryl thiols, which include a thiol group attached to an aromatic ring, are also useful in the ink 20. Examples of useful aryl thiols include biphenyl thiols and terphenyl thiols. The biphenyl and terphenyl thiols can be substituted with one or more functional groups at any of a variety of locations. Other examples of useful aryl thiols include acene thiols, which may or may not be substituted with functional groups.

Useful thiols can include linear conjugated carbon-carbon bonds, for example double bonds or triple bonds, and can be partially or completely fluorinated.

The ink solutions can include two or more chemically distinct organosulfur compounds. For example, the ink can include two linear alkyl thiol compounds, each with a different chain length. As another example, the ink 20 can include two linear alkyl thiol compounds with different tail groups.

Although microcontact printing has been carried out using neat organosulfur compounds to ink the stamp, the delivery of organosulfur compounds to the stamp can be achieved more uniformly, and with less stamp swelling in the case of linear alkyl thiols and PDMS stamps, if delivered from a solvent-based ink. In some embodiments the ink includes more than one solvent, but most useful formulations need include only a single solvent. Inks formulated with only one solvent may contain small amounts of impurities or additives, for example stabilizers or desiccants.

Useful solvents are preferably compatible with PDMS (that is, they do not excessively swell PDMS), which is the most commonly used stamp material for microcontact printing. In microcontact printing, swelling of the PDMS stamp can lead to distortion of the patterned features and poor pattern fidelity. Depending on the inking approach, excessive swelling can also present significant challenges in providing mechanical support to the stamp.

Ketones can be suitable solvents for the ink solutions. In some embodiments, suitable solvents include, for example, acetone, methyl ethyl ketone, ethyl acetate, and the like, and combinations thereof. Acetone is a particularly preferred solvent. The one or more organosulfur compounds (for example, thiol compounds) are present in the solvent in a total concentration of at least about 3 millimoles (mM). As used herein, the "total concentration" refers to the molar concentration of all the dissolved organosulfur compounds taken in aggregate. The one or more organosulfur compounds (for example, thiol compounds) can be present in any total concentration in which the ink solution consists of essentially a single phase. The one or more organosulfur compounds (for example, thiol compounds) can be present in total concentrations of at least about 5 mM, at least about 10 mM, at least about 20 mM, at least 50 mM, and even at least about 100 mM.

The stamp 40 can be "inked" with the ink solution using methods known in the art (for example, as described in Libioulle et al. "Contact-Inking Stamps for Microcontact Printing of Alkanethiols on Gold," Langmuir Vol. 15, pp. 300-304 (1999)). In one approach, an applicator (for example, a cotton swab or a foam applicator) impregnated with the ink solution can be rubbed across the stamping surfaces of the stamp 40, followed by drying of solvent from the stamping surfaces. In another approach, the stamping surfaces can be pressed against an "ink pad" impregnated with the ink solution, the ink pad optionally being a PDMS slab. In another approach, the stamp 40 can be charged with ink solution from its back side, relative to the printing surface. In the latter approach, the organosulfur compound diffuses through the stamp to reach the relief-patterned face for printing. In another embodiment, the relief-patterned printing face of the stamp can be immersed in the ink solution, followed by withdrawal and drying ("immersive inking").

It is usually desirable for the web 22 to make very light contact with the microcontact printing stamp 40. A contact pressure of less than 2 psi (13.7 kPa) is considered suitable, or even less than 1 psi (6.9 kPa), or further even less than 0.5 psi (3.4 kPa). Additionally, it may be desirable that the web 22 be in contact with the micro-contact printing stamp for a short time. For example the web 22 may be contact with less than 50% of the circumference of the roll, less than 25%, or even less than 15%, or further even less than 5%. In some embodiments the web 22 is in contact with the outer circumference of the sleeve or roll for 2-4 inches (5.1-10.2 cm) of surface arc such as 3 inches (7.6 cm). The wrap angle is dependent on web speed and tension since increasing the wrap assists in driving sleeve 32' but can result in reduced print quality if registration is lost. Shorter wrap angles can improve print quality, but may not have sufficient contact to drive the sleeve. In general, it is desirable for the microcontact printing stamp and web to contact each other for at least 3-5 milliseconds such as for 4 milliseconds. Longer contact times can increase the printed width of the pattern on the substrate undesirably. A minimum contact duration is needed to form an assembled monolayer with the thiol solution on the substrate, but increasing that time too much leads to the printed line width widening, and increases the likelihood of smearing or double printed images due to relative motion between the surfaces during printing. Thus, the speed of the substrate should also be considered when deciding on the wrap angle to ensure a desirable contact time duration.

The tension of the web 22 can vary. Higher tensions can be used to generate more driving force for the sleeve or roll and reduce air entrainment, but also can lead to a collapse of the printing features on the micro-contact printing stamp. Suitable tensions can be in the range of 1-2 pound/linear inch (1.75 to 3.5 Newton/linear cm) depending on the wrap angle of the substrate on the roll or sleeve. In some convenient embodiments, one or more of entry roller 26, exit roller 28, or stamp roll assembly 30 may be on adjustable mounts so as to readily change the contact pressure and/or the percentage of the circumference of roll 32 over which contact between the web 22 and the stamp 40 is occurring can be adjusted.

Precise lateral control over the position of the roll 32 is desirable for accurate printing. Expedients for controlling the lateral position of a thin shell roll can be found in copending and coassigned U.S. patent application Ser. No. 12/993,138 entitled, "Method for Continuous Sintering on Indefinite Length Webs," filed on May 20, 2009 which is hereby incorporated by reference in its entirety.

Figure 2:
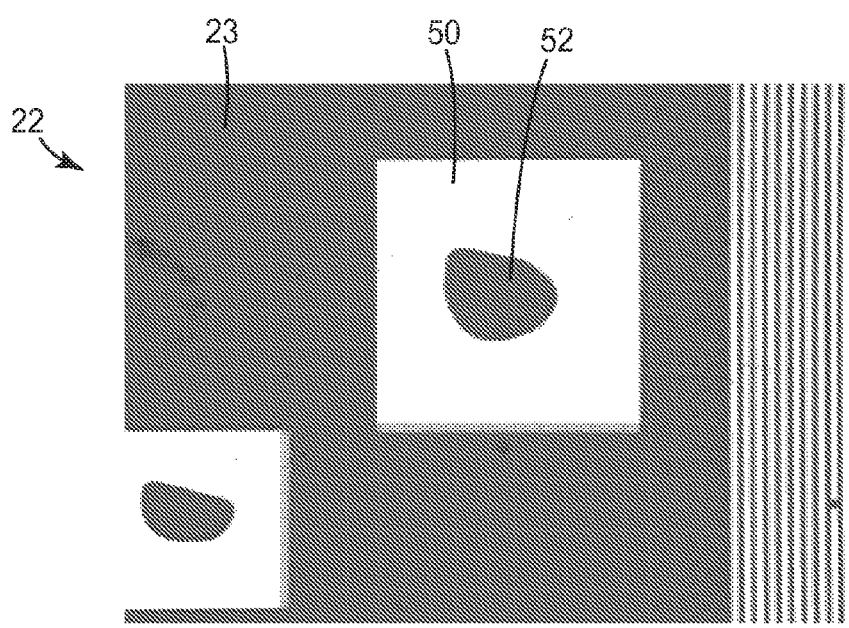
FIG. 2 is a schematic overhead view of voids in a solid printed feature caused by air trapped between a microcontact printing stamp and a substrate.

In a roll-to-roll process in which the contact front 41 between the surface 23 of the web 22 and the microcontact stamp 40 is moving, as speed of printing increases, more air gets trapped between the stamp 40 and the surface 23. When the surface 23 contacts the microcontact printing stamp 40, any air that is trapped between the surface 23 and the stamp 40 can cause an air bubble between the two mediums, which does not allow 100% of the intended (i.e., the raised surface of the stamp 40) contact of the stamp to the web material 22. At higher printing speeds, this entrained air trapped at the interface between the stamp 40 and the surface 23 can create an area, referred to herein as an uncontrolled void, where a particular pattern element of the design on the stamp surface is not 100% transferred to the surface of the substrate. FIG. 2 shows an example of an uncontrolled void on a surface 23 of a metalized, printed, and etch-patterned web material 22, which appears as an un-printed region 52 in a printed pattern 50.

In one embodiment, the present disclosure is directed to modified pattern elements on a printing surface of the stamp 40 that include: (1) air bleed features in the form of elongated concavities that allow a path for the entrained air to escape; and/or, (2) interior voids within a pattern element that temporarily store the entrained air during the time the pattern element is in contact with the surface 23 of the web material 22. In some embodiments, the modified pattern elements can improve the accuracy of the transfer of the ink from the stamp 40 to the surface 23 without causing an unacceptable defect (e.g., an uncontrolled void) in the final printed part, particularly at higher printing speeds. In some embodiments, the modified printing elements can provide 100% design transfer (substantially defect-free transfer) from the stamp 40 to the surface 23, even at higher printing speeds.

"Elongated concavity" refers to an intrusive or concave feature at the perimeter of a continuous two-dimensional shape, wherein the feature has a long axis and wherein the long axis extends generally into the two dimensional shape. In some embodiments, the shape may be a polygon. When the shape is a polygon, it is a concave polygon. In other embodiments, the shape may be non-polygonal. Non-limiting examples of shapes having elongated concavities that are not polygons are circles or ovals with elongated concavities. Other examples of such shapes are free forms with elongated concavities. An elongated concavity may also be described by its aspect ratio, given by its length divided by its average width. To be an elongated concavity, the aspect ratio is greater than 1, preferably greater than 2, more preferably greater than 5, more preferably greater than 10. In some embodiments, an elongated concavity can be branched.

"Interior void" refers to missing or removed area within a continuous two-dimensional shape. An interior pattern void is thus completely surrounded by the two-dimensional shape (i.e., the shape is continuous around the interior void). An interior void can be equiaxial (e.g., circle, square) or elongated (e.g., aspect ratio greater than 2, greater than 5, greater than 10). In some embodiments, an elongated interior pattern void can be branched. In some embodiments, the interior voids in the first pattern element in the first stamping surface form a mesh. What is meant by interior voids forming a mesh is that multiple discrete voids exist within the pattern element, separated by stamp raised area (when referring to a stamp) or patterned SAM (when referring to the printed SAM pattern) in the form of traces that thus form a continuous network.

"Fill factor" refers to the area fraction of a given region of a stamp that includes a raised feature or features. When a region of the stamp is used to transfer a pattern of a SAM, the resulting SAM is usually intended to have a fill factor that matches the fill factor of the region of the stamp. As used herein, the "open area" of a pattern is the complement of the filled area. Therefore open area fraction equals one minus fill factor.

The modified pattern elements described herein are particularly useful for stamp patterns that also include one or more low density pattern regions. As used herein, density refers to the local fill factor (local area fraction of raised elements on a stamp, which corresponds to the intended local area fraction of transferred SAM after printing; and when optionally followed by selective etching of a substrate metal, the intended area fraction of patterned metal.

The simultaneous microcontact printing of low density patterns and relatively higher density pattern elements can be challenging, particularly when the higher density pattern element is larger than about 0.1 square millimeter and the area of the low density region is larger than about 1 square centimeter. Low density regions (e.g., mesh geometries with fill factor of 0.25 to 10 percent) are very prone to stamp collapse (also referred to as stamp roof collapse), wherein the substrate is unintentionally contacted by recessed portions of the stamp surface, leading to printed SAM pattern inaccuracies (SAM transfer at locations where it was not intended). The roof collapse issue in low density regions and the air entrainment issue for solid (100 percent fill factor) pattern elements present conflicting requirements on the microcontact printing process. These conflicting requirements have previously resulted in low printing speeds (i.e., web transport speeds). The present disclosure reports pattern design concepts that in some embodiments can allow higher printing speeds, while avoiding collapse defects in low density regions and air entrainment defects (i.e., uncontrolled voids) in other pattern elements.

Figure 3A:
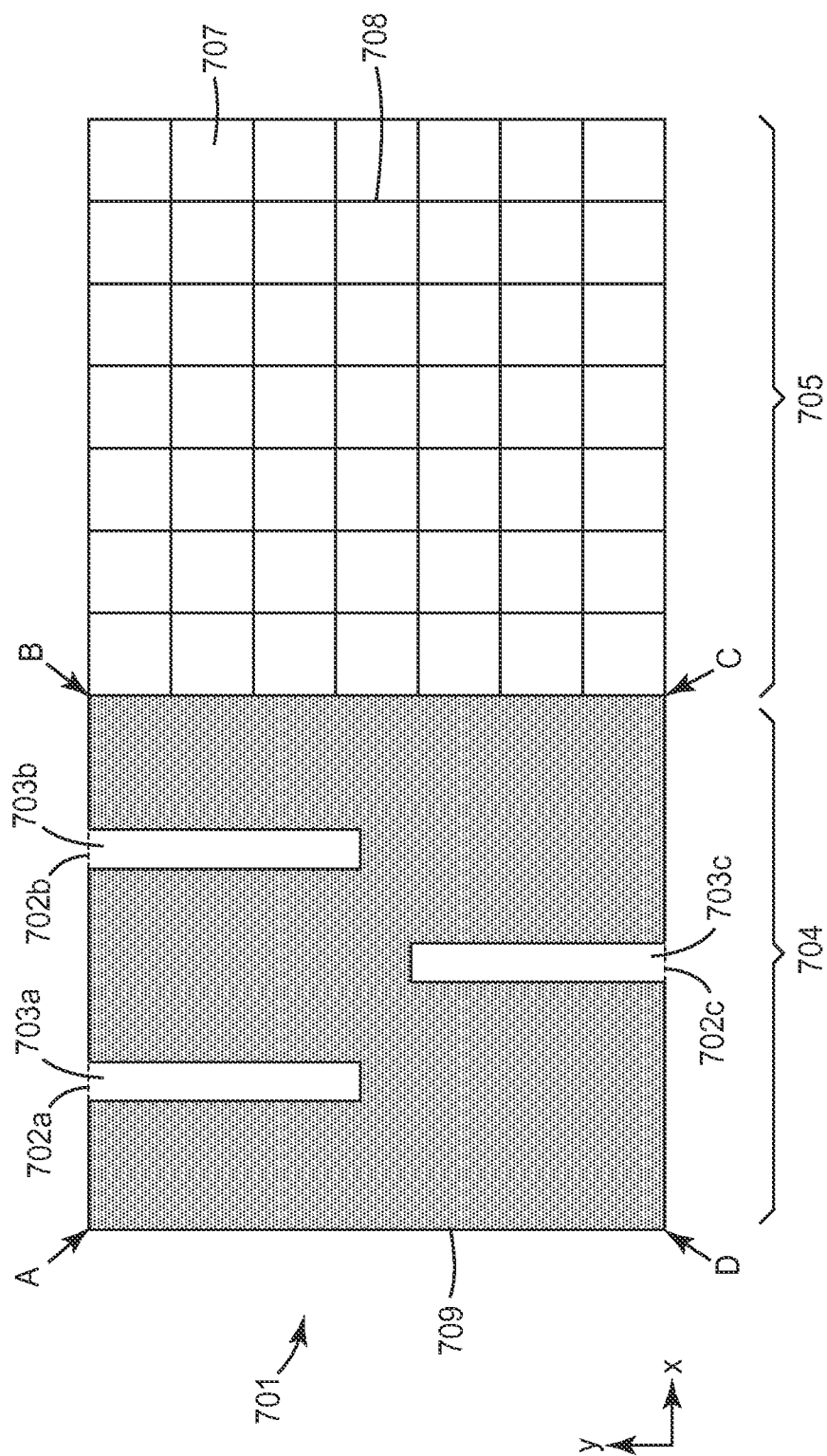

FIG. 3A is a schematic depiction of a microcontact printing stamp pattern of raised features. The pattern 701 includes a modified pattern element 704 with continuous and discontinuous regions, and a low density second pattern element 705, wherein the pattern element 704 and the pattern element 705 are contiguous. The modified pattern element 704 includes a continuous region 709, as well as discontinuous regions with elongated concavities 703*a*, 703*b*, and 703*c*. The extent of modified pattern element 704, as a reference for defining its geometric modifications and fill factor, is the polygon ABCD. Elongated concavitites 703*a*, 703*b*, and 703*c* extend from the perimeter of ABCD, as clarified by guidelines 702*a*, 702*b*, and 702*c*. The fill factor of modified pattern element 704 is calculated as the continuous shaded area 709 divided by the overall area of polygon ABCD. Stated differently, the fill factor of modified pattern element 704 is calculated as: (area of polygon ABCD minus the sum of the areas of elongated concavities 703*a*, 703*b*, and 703*c*) divided by (area of polygon ABCD). The modified pattern element 704 may have a fill factor from 20 to 99 percent, preferably from 50 to 95 percent.

The low density region 705 includes a network of connected traces 708, defining enclosed mesh cells 707. The low density region 705 may have a fill factor from 0.25 to 10 percent, preferably from 0.5 to 5 percent. A non-limiting example of a low density region is a square mesh including 1 micrometer wide traces on a 200 micrometer pitch (ca. 1 percent fill factor).

Figure 3B:
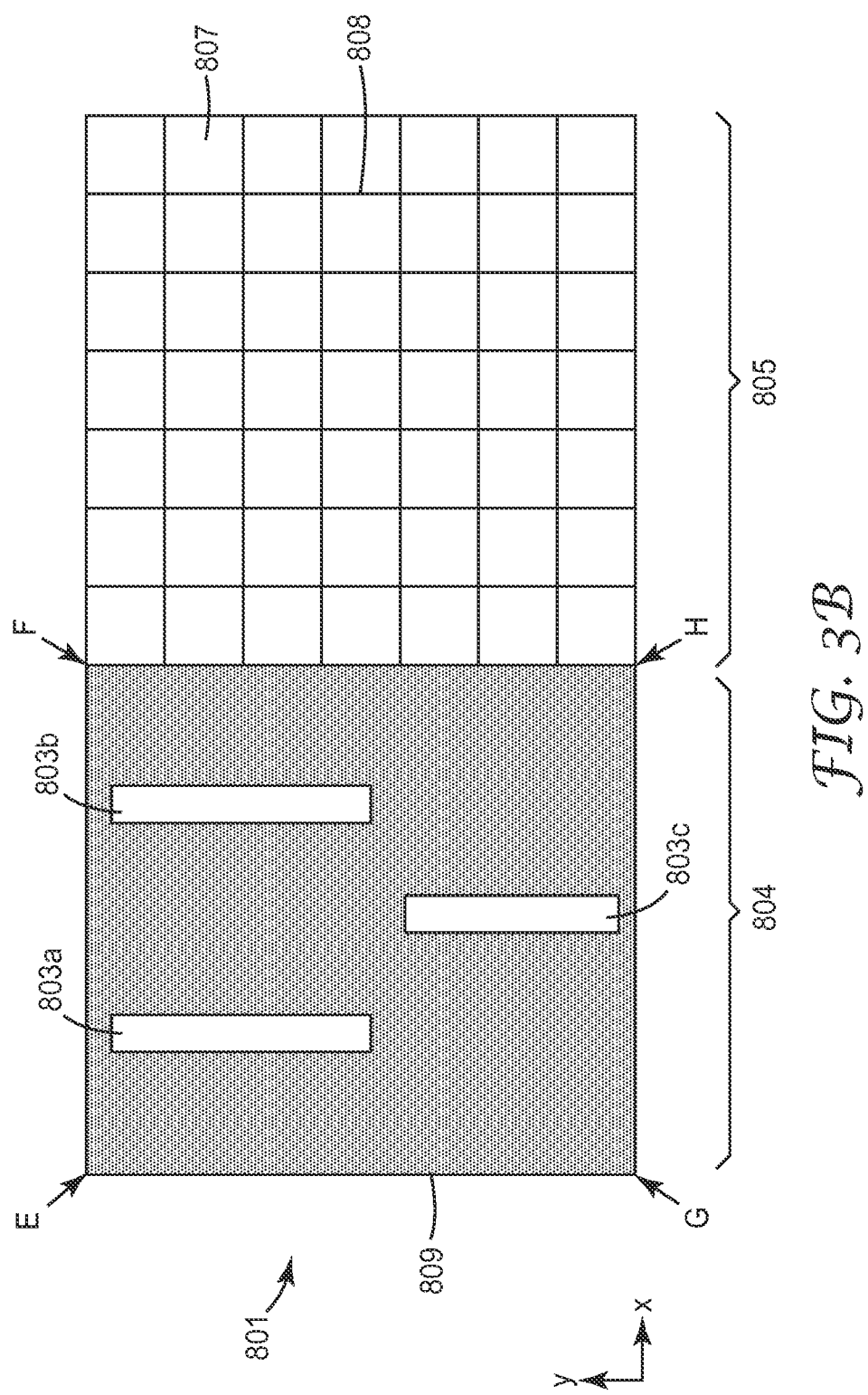

FIG. 3B is a schematic depiction of a microcontact printing stamp pattern of raised features. The pattern 801 includes a modified pattern element 804 and a contiguous low density region 805. The modified pattern element 804 includes a continuous region 809 and discontinuous regions including interior voids 803*a*, 803*b*, and 803*c*. The extent of modified pattern element 804, as a reference for defining its geometric modifications and fill factor, is the polygon EFGH. The fill factor of modified pattern element 804 is calculated as the shaded area 809 divided by the overall area of polygon EFGH. Stated differently, the fill factor of modified pattern element 804 is calculated as: (area of polygon EFGH minus the sum of the areas of interior pattern voids 803*a*, 803*b*, and 803*c*) divided by (area of polygon EFGH). The modified pattern element may have a fill factor from 20 to 99 percent, preferably from 50 to 95 percent. The low density region 805 includes a network of connected traces 808, defining enclosed mesh cells 807. The low density region 805 may have a fill factor from 0.25 to 10 percent, preferably from 0.5 to 5 percent. A non-limiting example of a low density region is a square mesh comprising 1 micrometer wide traces on a 200 micrometer pitch (ca. 1 percent fill factor).

FIG. 3C is a schematic depiction of a microcontact printing stamp pattern of raised features. The pattern 901 includes a modified pattern element 904 contiguous with a low density region 905. The modified pattern element 904 includes a continuous region 909 with a plurality of discontinuous regions forming an array of interior voids 906. The modified pattern element 904 is described herein as a mesh or a mesh geometry. The extent of modified pattern element 904, as a reference for defining its geometric modifications and fill factor, is the polygon IJKL. The fill factor of modified pattern element 904 is calculated as the shaded area 909 divided by the overall area of polygon IJKL. Stated differently, the fill factor of modified pattern element 904 is calculated as: (area of polygon IJKL minus the sum of the areas of interior pattern voids 906) divided by (area of polygon IJKL). The modified pattern element 904 may have a fill factor from 20 to 99 percent, preferably from 50 to 95 percent. The low density region 905 includes a network of connected traces 908, defining enclosed mesh cells 907. The low density region 905 may have a fill factor from 0.25 to 10 percent, preferably from 0.5 to 5 percent. A non-limiting example of a low density region is a square mesh including 1 micrometer wide traces on a 200 micrometer pitch (ca. 1 percent fill factor).

Figure 3D:
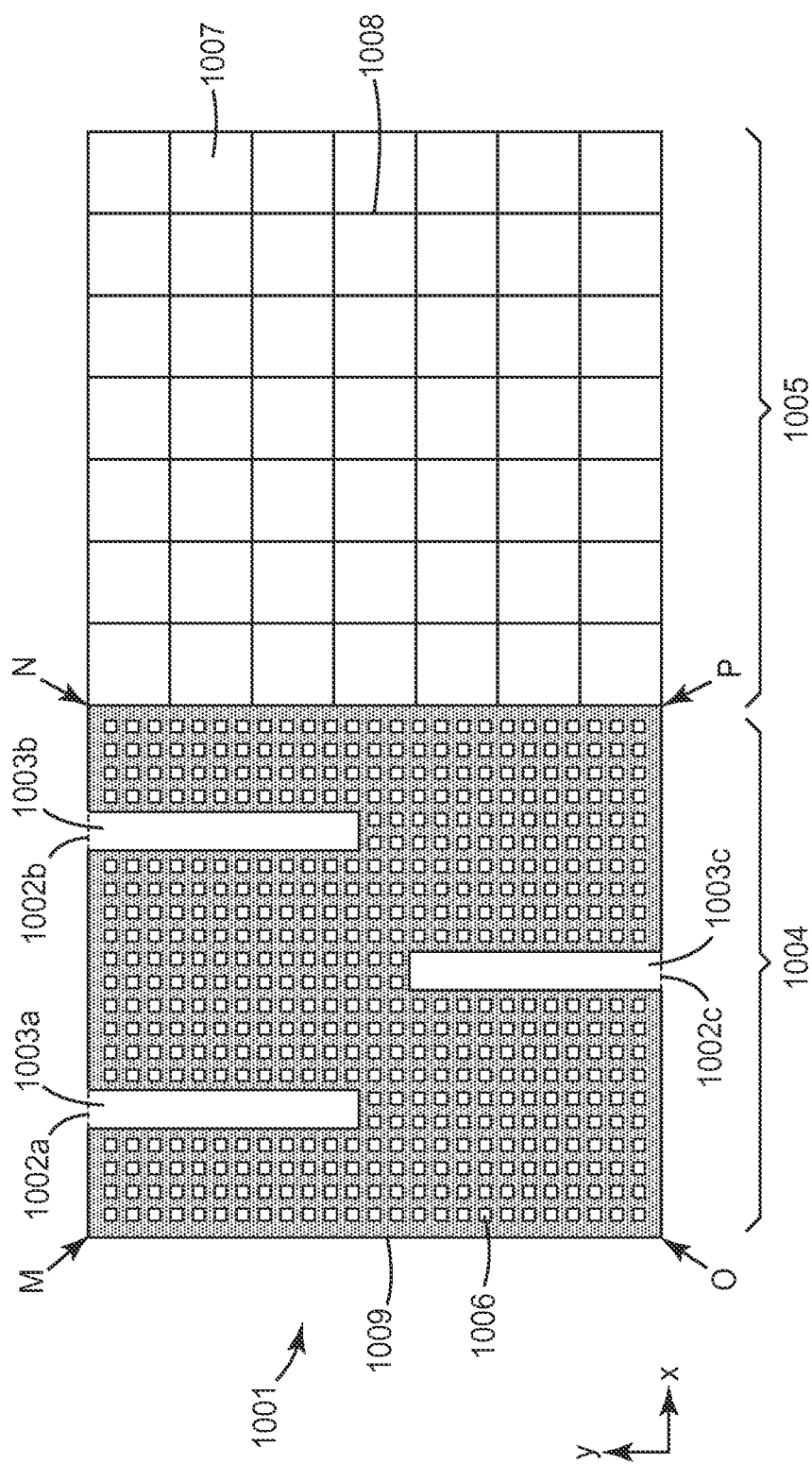

FIG. 3D is a schematic depiction of a microcontact printing stamp pattern of raised features. The pattern 1001 includes a modified pattern element 1004 contiguous with a low density region 1005. The modified pattern element 1004 includes a continuous region 1009 and a plurality of discontinuous regions including elongated concavities 1003a, 1003b, and 1003c, as well as an array of interior voids 1006. The modified pattern element 1004 is described herein to as a mesh geometry. The extent of modified pattern element 1004, as a reference for defining its geometric modifications and fill factor, is the polygon MNOP. Elongated concavitites 1003a, 1003b, and 1003c extend from the perimeter of MNOP, as clarified by guidelines 1002a, 1002b, and 1002c. The fill factor of modified pattern element 1004 is calculated as the shaded area 1009 divided by the overall area of polygon MNOP. Stated differently, the fill factor of modified pattern element 1004 is calculated as: (area of polygon MNOP minus the sum of the areas of elongated concavities 1003a, 1003b, and 1003c, as well as interior pattern voids 1006) divided by (area of polygon MNOP). The modified pattern element may have a fill factor from 20 to 99 percent, preferably from 50 to 95 percent. The low density region 1005 includes a network of connected traces 1008, defining enclosed mesh cells 1007. The low density region 1005 may have a fill factor from 0.25 percent to 10 percent, preferably from 0.5 to 5 percent. A non-limiting example of a low density region is a square mesh comprising 1 micrometer wide traces on a 200 micrometer pitch (ca. 1 percent fill factor).

Figure 3E:
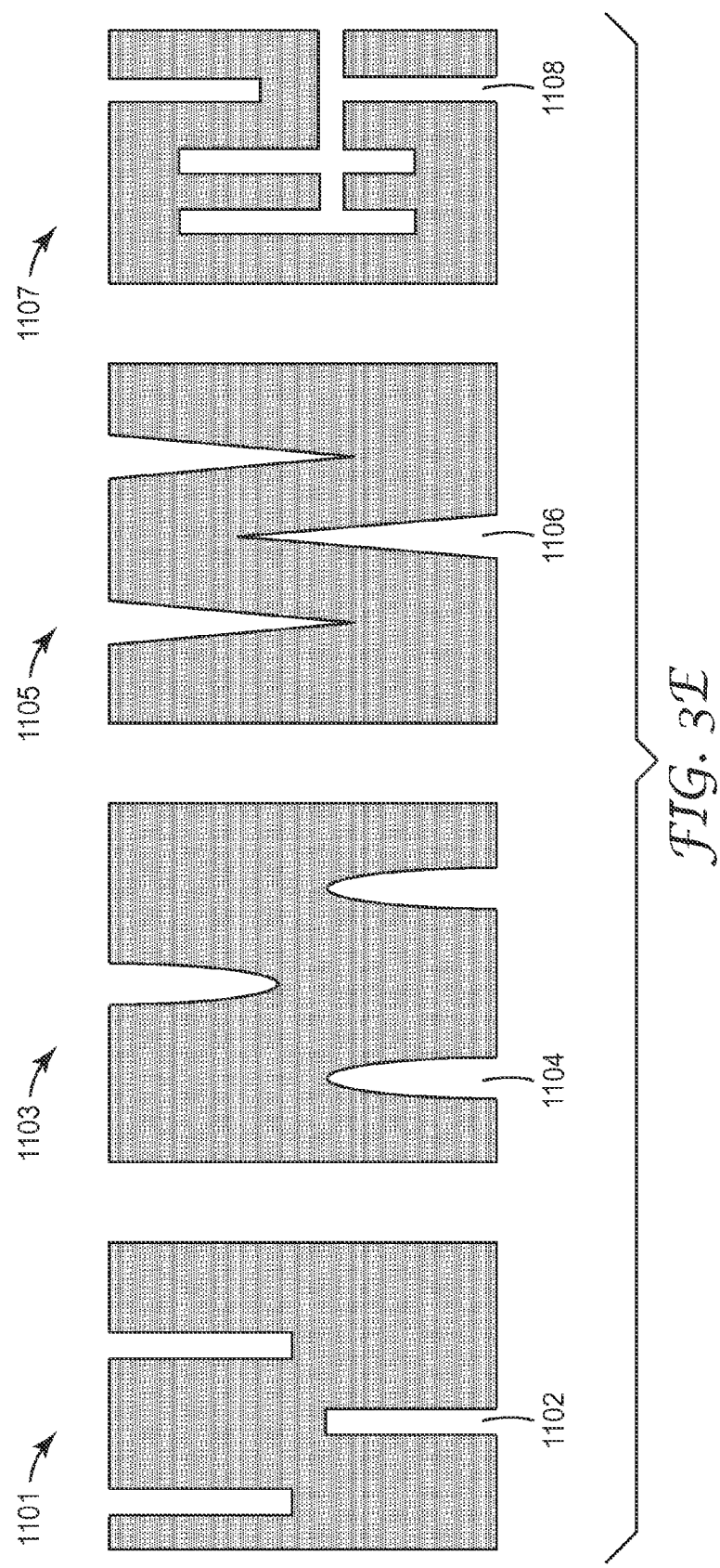
FIGS. 3E-3F are schematic overhead views of embodiments of modified pattern elements on a stamp suitable in a microcontact printing process.

FIG. 3E includes schematic depictions of examples of microcontact printing stamp patterns of raised features, including various geometries for elongated concavities, which are not intended to be limiting. Modified pattern elements 1101, 1103, 1105, and 1107 include discontinuous regions of elongated concavities 1102, 1104, 1106, and 1108. Elongated concavities 1102 have straight and parallel sides, as well as right angle corners. Elongated concavities 1104 have curved sides and no corners. Elongated concavities 1106 include straight, non-parallel sides that converge. Elongated concavity 1108 is branched, while elongated concavities 1102, 1104, and 1106 are unbranched. The elongated concavities may have sides that are neither straight nor elliptical, as depicted in FIG. 3E. For example, the elongated concavities may have meandering or wavy sides. While the elongated concavities are depicted in FIG. 3E to have only two long axis orientations (separated by 180 degrees), elongated concavities within the scope of the present disclosure are not limited in terms of their orientations. As depicted in FIGS. 3A-D, the modified pattern elements 704, 804, 904, 1004, and others described herein can be connected to the elements (e.g., traces) of a low density region (e.g., low density mesh).

Figure 3F:
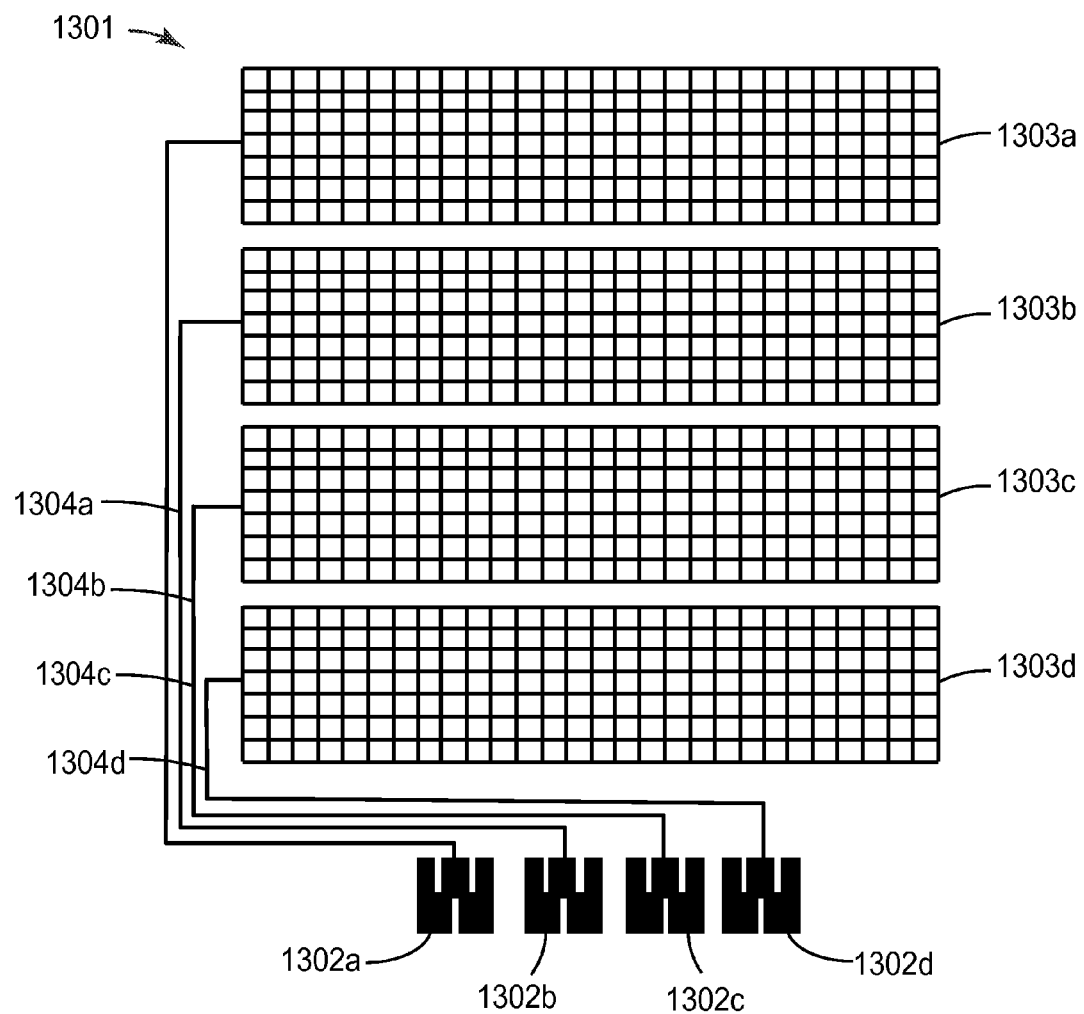

FIG. 3F is a schematic depiction of another embodiment of a microcontact printing stamp pattern of raised features. The pattern 1301 includes an arrangement of modified pattern elements 1302a, 1302b, 1302c, 1302d, which each include discontinuous regions with linear elongated concavities. The modified pattern elements are connected to respective low density mesh regions 1303a, 1303b, 1303c, 1303d through interconnect traces 1304a, 1304b, 1303c, 1303d, respectively.

In various embodiments, the low density regions 705, 805, 905, 1005 and others described herein may include traces having width of 0.1 to 50 micrometers, or 0.25 to 25 micrometers, or 0.5 to 10 micrometers, or 0.75 to 3 micrometers. In various embodiments, the low density regions 705, 805, 905, 1005, and others described herein may include traces organized into a mesh geometry (network of connected traces defining enclosed cells) having fill factor of 0.25 to 10 percent, or 0.5 to 5 percent, or 0.75 to 2.5 percent, or 1 or 2 percent. In various embodiments, the low density regions 705, 805, 905, 1005, and others described herein have area of at least 1 square centimeter, in some embodiments between 1 square centimeter and 2 square meters, in some embodiments between 5 square centimeters and 1 square meter, in some embodiments between 10 square centimeters and 5000 square centimeters.

In various embodiments, the modified pattern elements 704, 804, 904, 1004, 1101, 1103, 1105, 1107, and others described herein may have fill factor from 20 to 99 percent, or from 22.5 to 95 percent, or from 25 to 80 percent, or from 60 to 90 percent. The modified pattern elements 704, 804, 904, 1004, 1101, 1003, 1105, 1107 and others described herein may have area between 0.1 square millimeters and 100 square centimeters, in some embodiments between 0.25 square millimeters and 10 square centimeters, in some embodiments between 0.5 square millimeters and 1 square centimeter, in some embodiments between 1 square millimeter and 25 square millimeters. The modified pattern elements 704, 804, 904, 1004, 1101, 1003, 1105, 1107 and others described herein may include a mesh (of stamp raised features, then in turn a mesh of printed SAM, then in turn a mesh of conductive traces) having traces of width between 0.1 and 100 micrometers, in some embodiments between 0.5 and 50 micrometers, in some embodiments between 1 and 25 micrometers, in some embodiments between 5 and 20 micrometers.

The microcontact printing stamp patterns (patterns of raised features) of FIGS. 3A-E can be used for printing SAM's with the same pattern geometries. The SAM patterns of the geometries of FIGS. 3A-E, when applied for example to a thin film metal on a substrate (e.g., a transparent substrate, for example a polymeric film substrate having itself a visible light transmittance of at least 60 percent, preferably at least 85 percent), can in turn be used for patterning the thin film metal into the same pattern geometry, by etching.

Figure 4A:
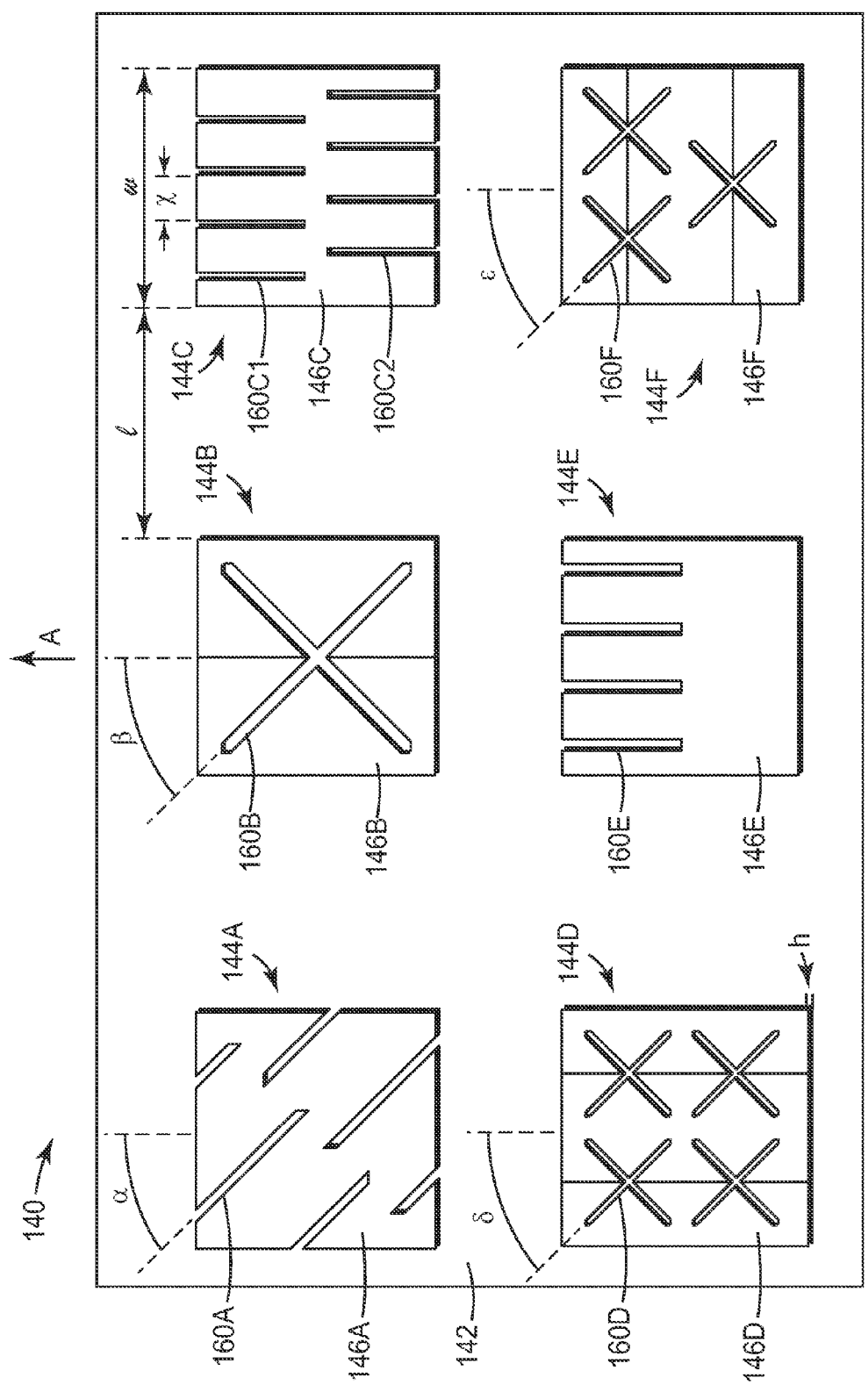
FIGS. 4A-4B are schematic overhead views of embodiments of modified pattern elements on a stamp suitable for use in a microcontact printing process.

FIG. 4A is a schematic depiction of a more embodiments of modified pattern elements that could be used on a microcontact printing stamp 140 including a substantially planar base printing surface 142. The modified pattern elements 144 extend away from the base printing surface 142, and each includes a stamping surface 146 that can be "inked" (have ink applied thereto) to transfer a substantially similar pattern and form a SAM on a surface of a substrate material using the system described above in FIG. 1.

The modified pattern elements 144 shown in FIG. 4A are merely provided as examples, and are not intended to be limiting.

In the embodiments shown in FIG. 4A the printing surfaces 146 of the modified pattern elements are substantially planar and substantially parallel to the base surface 142, although such a parallel arrangement is not required. The methods and apparatuses reported herein are also particularly advantageous for microcontact printing with modified pattern elements 144 having a height h of about 50 µm or less above the base surface 142, or about 10 µm or less, or about 5 µm or less, or about 1 µm or less, or about 0.25 µm or less.

The modified pattern elements 144 can occupy all or just a portion of the base surface 142 (some areas of the base surface 142 can be free of pattern elements). For example, in various embodiments the spacing l between adjacent modified pattern elements 144 can be greater than about 50

μm, or greater than about 100 μm, or greater that about 200 μm, or greater than about 300 μm, or greater than about 400 μm, or even greater than about 500 μm. Commercially useful arrays of modified pattern elements 144 for microcontact printing cover areas of for example, greater than 100 square centimeters, greater than 200 cm², or even greater than 1000 cm² on the base surface 142 of the stamp 140.

In some embodiments, the modified pattern elements 144 can comprise a portion of a "micropattern," which in this application refers to a pattern that includes an arrangement of dots, lines, filled shapes, or a combination thereof having a dimension (e.g. line width) of no greater than 1 mm. In some embodiments, the arrangement of dots, lines, filled shapes, or a combination thereof have a dimension (e.g. line width) of at least 0.5 μm and typically no greater than 20 μm. The dimension of the micropattern modified pattern elements 144 can vary depending on the micropattern selection, and in some embodiments, the micropattern pattern elements have a dimension (e.g. line width) that is less than 10, 9, 8, 7, 6, or 5 μm (e.g. 0.5 μm or 0.75-4 μm).

In some embodiments, the modified pattern elements 144 in FIG. 4A include discontinuous regions with elongated concavities that can be straight or curved. In some embodiments the modified pattern elements include interior voids. An array (regular or random) of interior pattern voids can lead to a complementary stamp raised feature pattern of a two-dimensional network (i.e., mesh). The mesh may be, for example, a square grid, a hexagonal mesh, or a pseudorandom mesh. Pseudorandom refers to an arrangement of traces that lacks translational symmetry, but that can be derived from a deterministic fabrication process (e.g., photolithography or printing), for example including a computational design process that includes generation of the pattern geometry with a randomization algorithm.

FIG. 4A schematically illustrates an arrangement of modified pattern elements 144A-144F that each include discontinuous regions of "cut-outs" selected to allow entrained air to escape (elongated concavities); and/or, temporarily store the entrained air (interior voids) during the time the modified pattern element 144 contacts an ink-receptive surface of a substrate material (e.g., a web substrate material), especially as contact front between the modified pattern element and the substrate moves along the direction of arrow A. In the non-limiting embodiments shown in FIG. 4, the discontinuous regions include cut-outs that are substantially linear elongated concavities or interior pattern voids 160 in the continuous regions of the printing surfaces 146 of the modified pattern elements 144, and these concavities and interior voids can include a wide variety of cross-sectional shapes, including square, rectangular, hemispherical, trapezoidal, V-shaped and the like. The embodiments of FIG. 4 also show that the linear elongated concavities or interior voids 160 extend fully to the base printing surface 142 and thus have a depth approximately equal to the height of the modified pattern element 144, but the depth of the elongated concavities or interior voids 160 may vary depending on the intended application.

In the schematic arrangement of FIG. 4A, the modified pattern element 144A includes discontinuous regions with an arrangement of linear elongated concavities 160 in the continuous region of the printing surface 146A that are oriented at an angle α with respect to the direction A. The angle α may vary widely depending on the intended application, and can be, for example, about 5° to about 90°, or about 30° to about 60°, or about 45°.

In the modified pattern element 144B, the continuous region of the printing surface 146B includes discontinuous regions with an arrangement of crossed, elongated, linear interior voids 160B each oriented at an angle β of about 45° with respect to the direction A to form an "X" like shape.

In the modified pattern element 144C, the continuous region of the printing surface 146C includes discontinuous regions with an arrangement of substantially parallel linear elongated concavities 160C1 and 160C2, each oriented at an angle of 0° with respect to the direction A. The concavities 160C1 are on a trailing edge of the pattern element 144C, while the concavities 160C2 are on a leading edge. The elongated concavities 160C1, 160C2 are also offset a distance x with respect to one another, and of course the distance x can vary widely depending on the intended application.

In the modified pattern element 144D, the continuous region of the printing surface 146D includes discontinuous regions with an arrangement of four crossed, elongated, linear interior voids 160D each oriented at an angle δ of about 45° with respect to the direction A to form an "X" like shape.

In the modified pattern element 144E, the continuous region of the printing surface 146E includes discontinuous regions with an arrangement of substantially parallel linear elongated concavities 160E oriented at an angle of 0° with respect to the direction A. The concavities 160E are on a trailing edge of the modified pattern element 144E. Each individual concavity 160E is also wider than the concavities 160C1, 160C2 in the pattern element 144C, which can in some embodiments enhance the evacuation of entrained air.

In the modified pattern element 144F, the continuous region of the printing surface 146F includes discontinuous regions with an arrangement of three crossed, elongated, linear interior voids 160F each oriented at an angle ε of about 45° with respect to the direction A to form an "X" like shape.

Figure 4B:
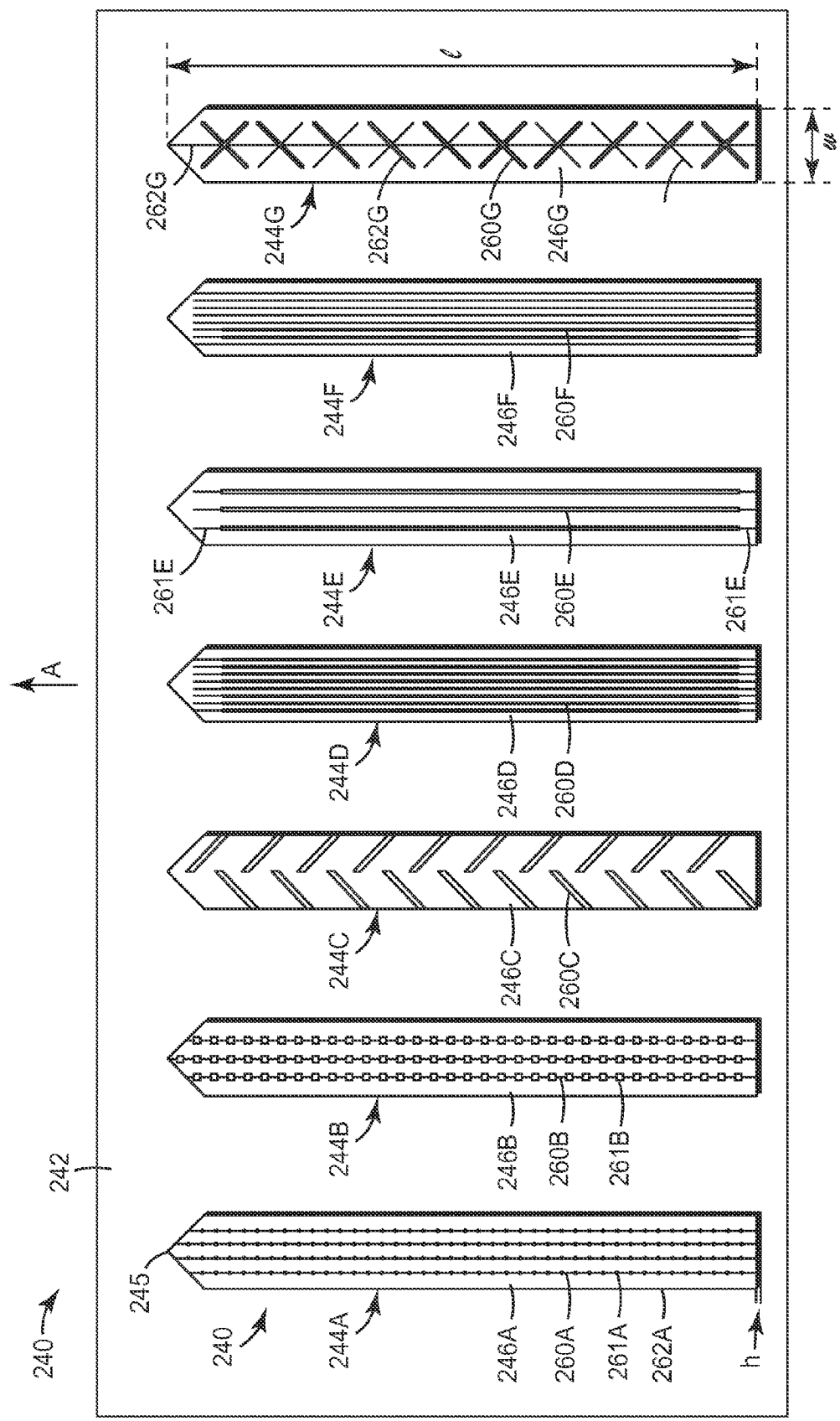

FIG. 4B is another schematic illustration of an array of different types of modified pattern elements 244 that might be used on a microcontact printing stamp 240 including a base surface 242. The pattern elements 244 extend upward from the base surface 242 to a height h and may have any length l and width w, but in some embodiments are generally linear structures in which the length l greatly exceeds the width w and the height h. In the embodiments of FIG. 4B, the modified pattern elements 244 taper at a leading edge to a point 245 directed along the direction A of travel of contact front between the stamp 240 and a substrate, which in some embodiments can help to smoothly and gradually engage the surface of pattern element 246 with the surface of a web material and evacuate entrained air between the pattern element and the surface of a web material.

Some of the lines depicted in FIG. 4B are construction lines and are not representative of actual physical features of the modified pattern elements of microcontact printing stamp 240. The construction lines include 260A, 260B, 261E, and 262G.

For example, a modified pattern element 244A includes discontinuous regions with a two dimensional array of interior voids 261A that have can have different sizes and shapes as necessary for a specific application.

Another modified pattern element 244B includes discontinuous regions with a two dimensional array of interior voids 261B that have can have different sizes and shapes.

A modified pattern element 244C includes discontinuous regions with an arrangement of linear elongated concavities 260C in a surface 246C that are oriented at an angle α with respect to the direction A. The angle α may vary widely depending on the intended application, and can be, for example, about 5° to about 90°, or about 30° to about 60°, or about 45°.

Another modified pattern element 244D includes discontinuous regions with a linear array of substantially parallel elongated interior voids 260D. The elongated interior voids 260D are substantially the same size. The rendering of modified pattern element 244D includes fine construction lines, parallel to the elongated interior voids 260D.

A modified pattern element 244E includes discontinuous regions with a linear array of substantially parallel elongated interior voids 260E extending into a surface 246E. The elongates interior voids 260E are substantially the same depth and width. The rendering of modified pattern element 244D includes fine construction lines, parallel to the elongated interior voids 260E.

A modified pattern element 244F includes discontinuous regions with a linear array of substantially parallel elongated interior voids 260F The rendering of modified pattern element 244F includes fine construction lines, parallel to the elongated interior voids 260E.

A modified pattern element 244G includes discontinuous regions with an arrangement of "X"-like patterns made up crossed interior voids 260G, each branch of which being oriented at an angle β of about 45° with respect to the direction A.

As will be apparent to one of ordinary skill in the art, when inked and contacted with a suitable substrate, the pattern elements of FIGS. 3A-3E and 4A-4B can provide a corresponding pattern of ink on the substrate. As will be apparent to one of ordinary skill in the art, a pattern of ink on the substrate, when the substrate is a metalized substrate, can provide a corresponding pattern of the metal on the substrate, after selective etching.

The thin film metal pattern elements corresponding to the stamp modified pattern elements of FIGS. 3A-E and 4A-B can serve any of a variety of purposes or functions. For metal patterned substrates according to the pattern designs in FIGS. 3A-E and 4A-B, the modified pattern elements may serve as bond pads. Bond pads are conductor pattern elements to which another conductor is physically and electrically bonded, for example through an anisotropically conductive film (ACF) adhesive, solder, or an ultrasonic wirebond. Examples of ACF materials and bonds are described in U. S. Patent Application Publication US2008/0171182. ACF materials include conductive particles dispersed in an electrically insulating adhesive matrix. In some embodiments, the bond pads designed according to the parameters described above for modified pattern elements have the advantage of balancing physical bond strength (desired to be high) and electrical resistance (desired to be low). The geometric parameters and shapes listed above for modified pattern elements are particularly useful for balancing bond strength performance against electrical resistance performance when the conductive pattern of a metal patterned substrate comprises a SAM thereon, thus the SAM being interposed between the conductive metal of the metal patterned substrate and the ACF adhesive.

Some embodiments of the present disclosure are electrical assemblies that include electrically conductive patterns according to the modified pattern elements of the stamps exemplified in FIGS. 3A-E and 4A-B. In some embodiments, the modified pattern elements can be bonded to a conductor of a second substrate through, for example, an anisotropically conductive film adhesive that is loaded with conductive particles.

Figure 5:
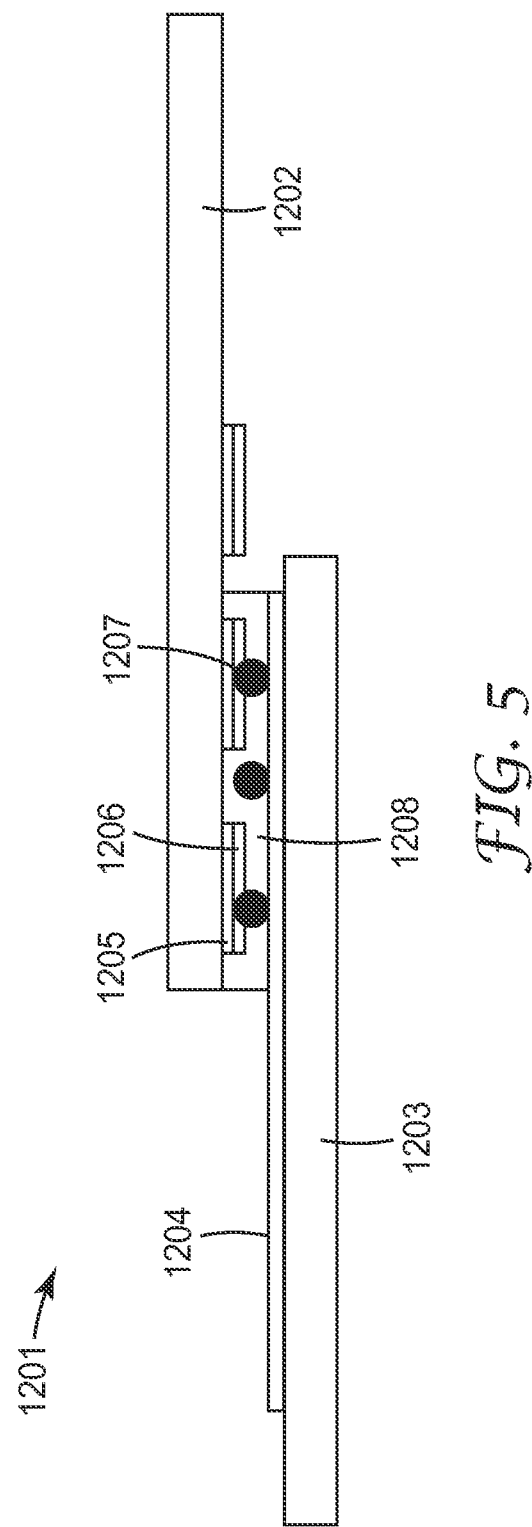
FIG. 5 is a schematic cross section of an electrical assembly comprising an anisotropically conductive film adhesive.

FIG. 5 is a cross sectional schematic of an electrical assembly 1201. The metal patterned substrate 1202 including metal pattern 1205 has a design according to any of the aforementioned modified pattern elements, and optionally any of the low density regions. The metal pattern 1205 optionally includes a SAM 1206 thereon. The metal patterned substrate 1202 is ACF bonded at its modified pattern element as described herein to electrical component 1203 with its own conductor pattern 1204. Bonding is achieved with a layer of an ACF adhesive 1208. Electrical connection is achieved with ACF conductive filler particles 1207.

In some embodiments, the 90 degree peel strength (expressed as peak load divided by width of the bond; also referred to herein as the bond strength per unit bond length) of the above described ACF bond is at least 100 grams-force per centimeter, preferably at least 250 grams-force per centimeter, more preferably greater than 500 grams-force per centimeter, more preferably greater than 750 grams-force per centimeter, most preferably greater than 1000 grams-force per centimeter. In some embodiments the electrical contact resistance of the above described ACF bond (expressed as ohms per square millimeter) is less than 1000 ohms per square millimeter, preferably less than 100 ohms per square millimeter, more preferably less than 50 ohms per square millimeter, most preferably less than 10 ohms per square millimeter. In some embodiments that included a SAM interposed between the conductor of a metal patterned substrate and the ACF adhesive, the bond strength per unit bond length and the bond electrical contact resistance per unit area are simultaneously greater than 500 grams-force per centimeter and less than 50 ohms per square millimeter (preferably less than 10 ohms per square millimeter), respectively.

Suitable electrical components 1203 may be, for example, a flexible printed circuit (FPC), printed wiring board (PWB), printed circuit board, a thick film ceramic circuit, or a glass substrate bearing a thin film or thick film conductor pattern.

In some embodiments, the metal-patterned substrate 1202 is glass, and examples of glass substrates bearing a conductor pattern (an example of component 1202) include subcomponents of touchscreen sensors, for example a touchscreen display cover lens having on its underside a pattern of transparent conductor (e.g., indium tin oxide, metal nanowire coating, carbon nanotube coating, graphene coating, metal mesh, conducting polymer such as PEDOT-PSS) and a pattern of interconnect traces (the aforementioned thin film or thick film conductor pattern).

In some embodiments, ACF bonding of the metal patterned substrates described herein (having the modified pattern elements and the low density regions) to touch screen cover lens components having transparent conductor and metal interconnect patterns may lead to a glass-one-film (G1F) touch screen sensor assembly. ACF bonding of the metal patterned substrates described herein (having the modified pattern elements and the low density regions) to an FPC or printed circuit board may lead to a touch screen sensor assembly. Other assemblies that may include the metal patterned substrates described herein (having the modified pattern elements, and optionally the low density regions), together with conductive bonds made thereto (e.g., ACF bonds), include photovoltaic cells, information displays (e.g., liquid crystal displays, electrophoretic displays, electrochromic displays, electroluminescent displays, polymer dispersed liquid crystal (PDLC) displays), variable optical density windows (e.g., electrochromic, suspended particle), switchable privacy panels (e.g., PDLC), integrated circuit packaging, and communication system components.

Additional discussion about the attachment of FPC's to bonding pads created by micro-contact printing may be found at U.S. Patent Application 61/840,876, "Method of Making Transparent Conductors on a Substrate."

In further embodiments, the surface of the stamp 40 can include a first region of fine pattern elements (e.g., a low density pattern of fine traces) that in some embodiments is adjacent to or contiguous with a second region including relatively dense pattern elements. At the interface between the first region of the stamp surface including the sparse (low density) pattern elements and the second region of the stamp surface including the dense pattern elements, the contact area between the stamp 40 and the surface 23 of the web material 22 can change dramatically, which can cause a pattern contrast defect in the printed region of the surface 23. A defect that appears when microcontact printing a non-uniform pattern design density is a pattern width contrast that can vary down the surface 23, depending on the uniformity of the design.

For example, in many touch sensor applications, the stamp 40 must include a first region with of pattern elements with printing surfaces capable of printing a portion of a pattern that is substantially transparent. For example, in some embodiments, the area coverage of the pattern in the substantially transparent region is a mesh that is less than 10% by area (e.g., includes a pattern fill factor from 0.25% to 10%), preferably less than 2% (e.g., includes a pattern fill factor from 0.5% to 2%). Notwithstanding an intention to pattern a mesh with uniform coverage (i.e., density or fill factor), for example using a stamp that includes such a mesh design of uniform coverage, a "pattern trace width contrast" defect in the mesh can become apparent if the mesh coverage in the resulting printed article varies as a function of location, for instance where the area coverage might be 1.8% in some areas and only 1.4% in other areas. Also, when the stamp must include pattern elements to print very sparse features, such as a fine mesh pattern suitable for forming a touch electrode, as well as stamping elements to print dense features, such as a bonding contact pad, a pattern contrast defect can occur on the surface of the web material in the region where the contact area between the stamping surfaces and the surface of the web material changes dramatically (e.g., at a boundary between a low density region and an arrangement or array of higher density pattern elements (e.g., modified pattern elements as described herein).

Figure 6:
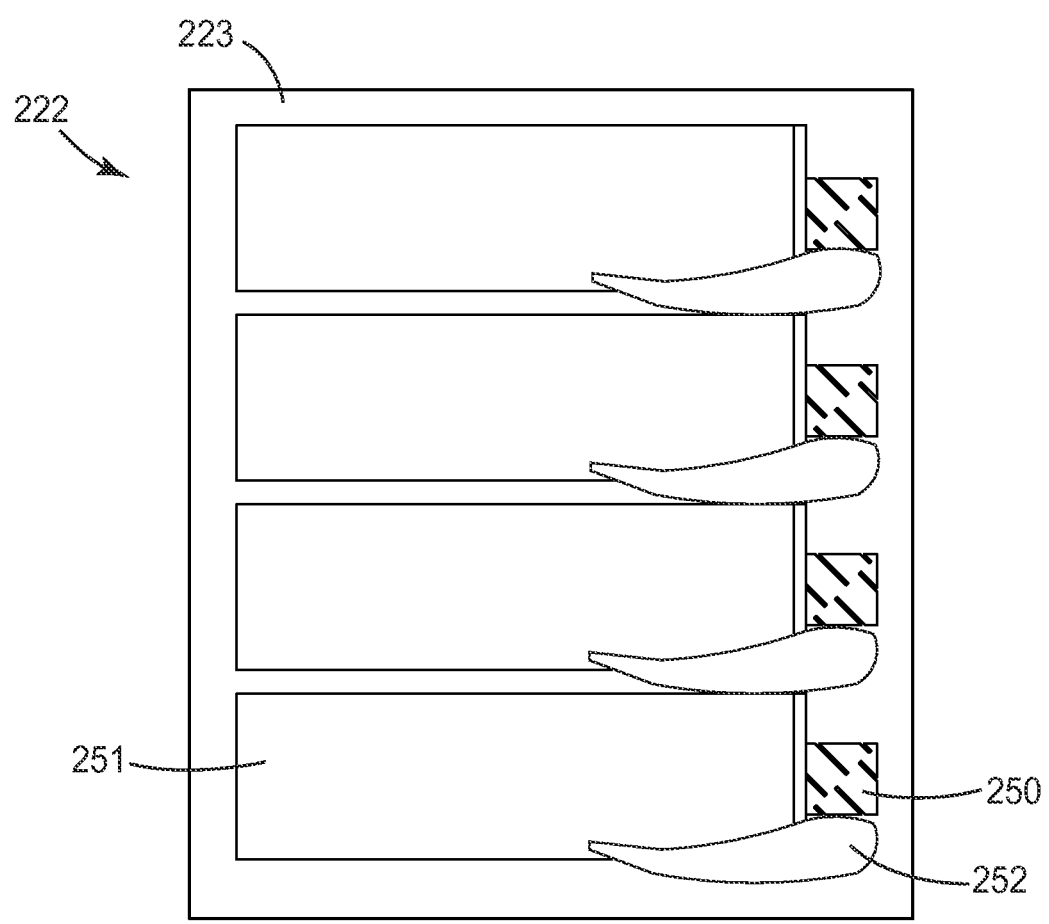
FIG. 6 is a schematic overhead view of a pattern-width contrast defect.

FIG. 6 is an illustration of a portion of a web material 222 with a surface 223 including printed features applied using a microcontact printing stamp 40 and the apparatus of FIG. 1. The printed features include a first region 250 with large, densely printed features contiguous with a substantially transparent second region 251 with sparsely printed features. A "swoosh-like" non-uniform pattern density defect 252 occurs at the interface between the first region 250 and the second region 251 where the contact area between the surfaces of the microcontact printing stamp and the surface of the web material 223 changes dramatically over a relatively short distance.

In one embodiment, the surface of the stamp may optionally include additional traction features to provide an overall increase in contact area between the stamp and the surface of the web material, which can lessen the impact of small density changes in a region of the stamp with fine pattern elements. In another embodiment, traction features may optionally be positioned between large, dense pattern elements on the stamping surface to create an even more uniform contact area for microcontact printing, particularly a uniform or consistent contact area along the printing contact front propagation direction. Adding an appropriate amount of traction features along the edge of the stamping surface and/or between the large pattern elements can in some cases substantially reduce or eliminate the down web contrast defects that arise with a dramatic pattern element density change.

Figure 7A:
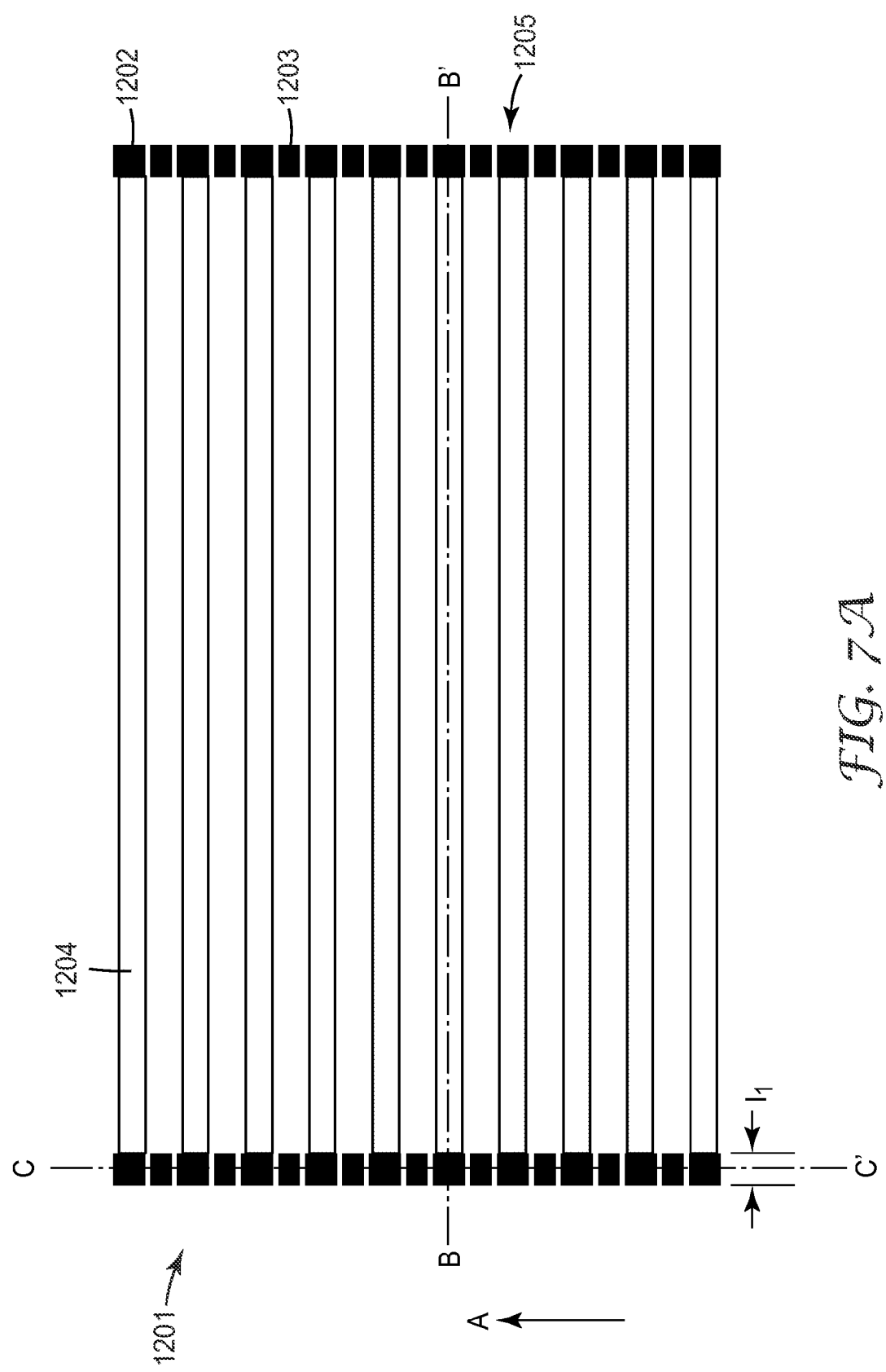
FIG. 7A is a schematic overhead view of a stamp suitable in a microcontact printing process, including traction features added to functional pattern elements.
Figure 7B:
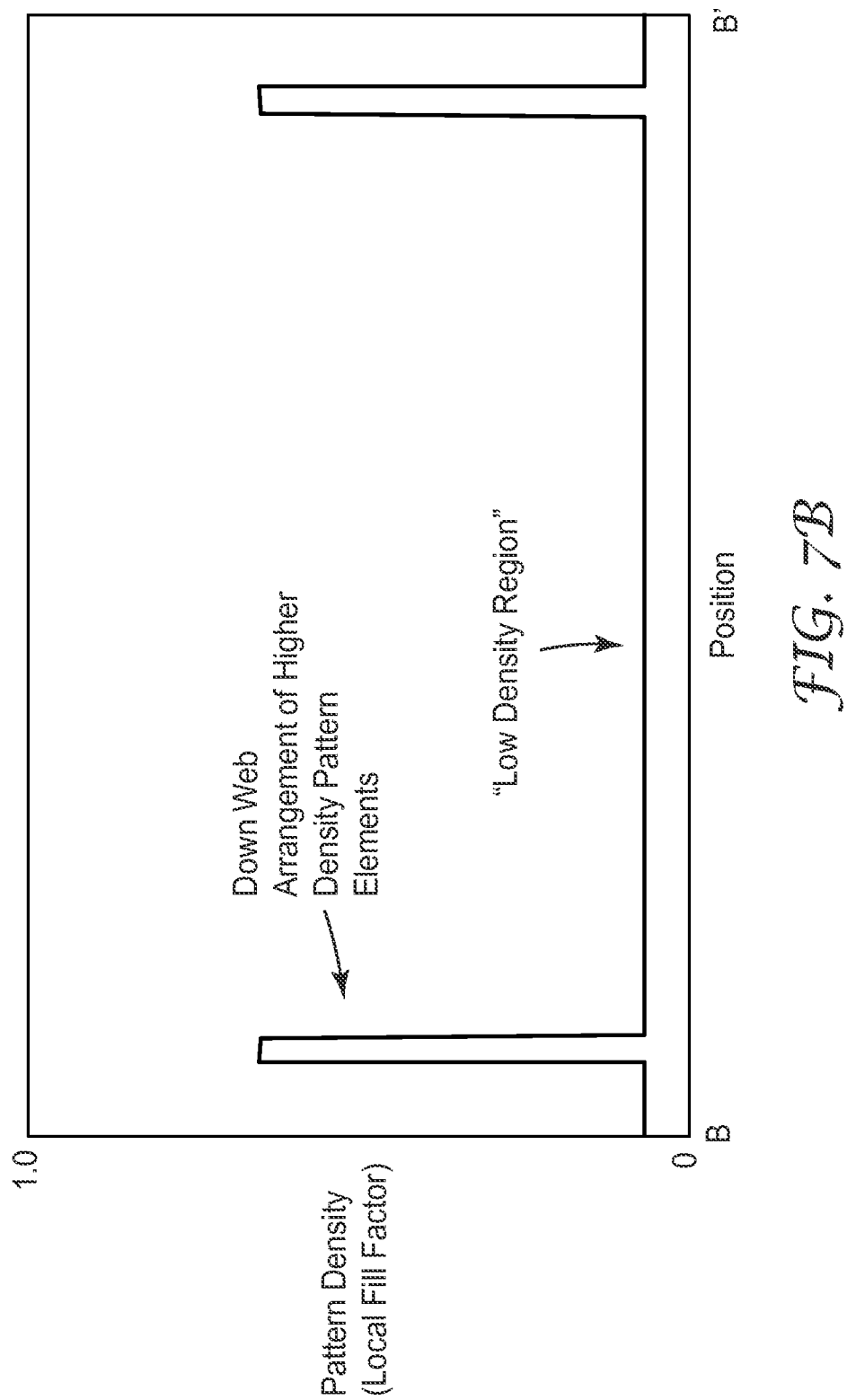
FIG. 7B is a plot of pattern density vs. position along line BB' on the microcontact printing stamp of FIG. 7A.

FIG. 7A illustrates a stamp with a raised feature pattern 1201 that includes functional pattern elements 1202 that are contact pads (examples of functional pattern elements) that connect with low density mesh pattern regions 1204, as well as added traction features 1203. The added non-functional traction features 1203 reduce the nonuniformity (inconsistency) of pattern density in the printing contact front propagation direction A that would exist in their absence (resulting from the spaced apart array of pattern elements 1202). In some embodiments of pattern designs, the pattern density variation along the printing contact front propagation direction is minimized. The line CC' lies along the downweb arrangement of functional pattern elements 1202. The line BB' lies along the cross web direction of the pattern, intersecting the relative high density (e.g., fill factor of 20% to 100%, preferably 50% to 95%) functional pattern elements (which may have, for example, the elongated concavities, interior voids, and fill factors described herein for modified pattern elements) and the low density region (e.g., low density mesh with fill factor of 0.25 to 10 percent, preferably 0.5% to 5%), as shown graphically in the plot of FIG. 7B. The following preferred levels of the uniformity or consistency of the density for relatively high density pattern elements are especially useful when the high density pattern elements are arranged along the printing contact front propagation direction and are adjacent to a low density region.

Figure 7C:
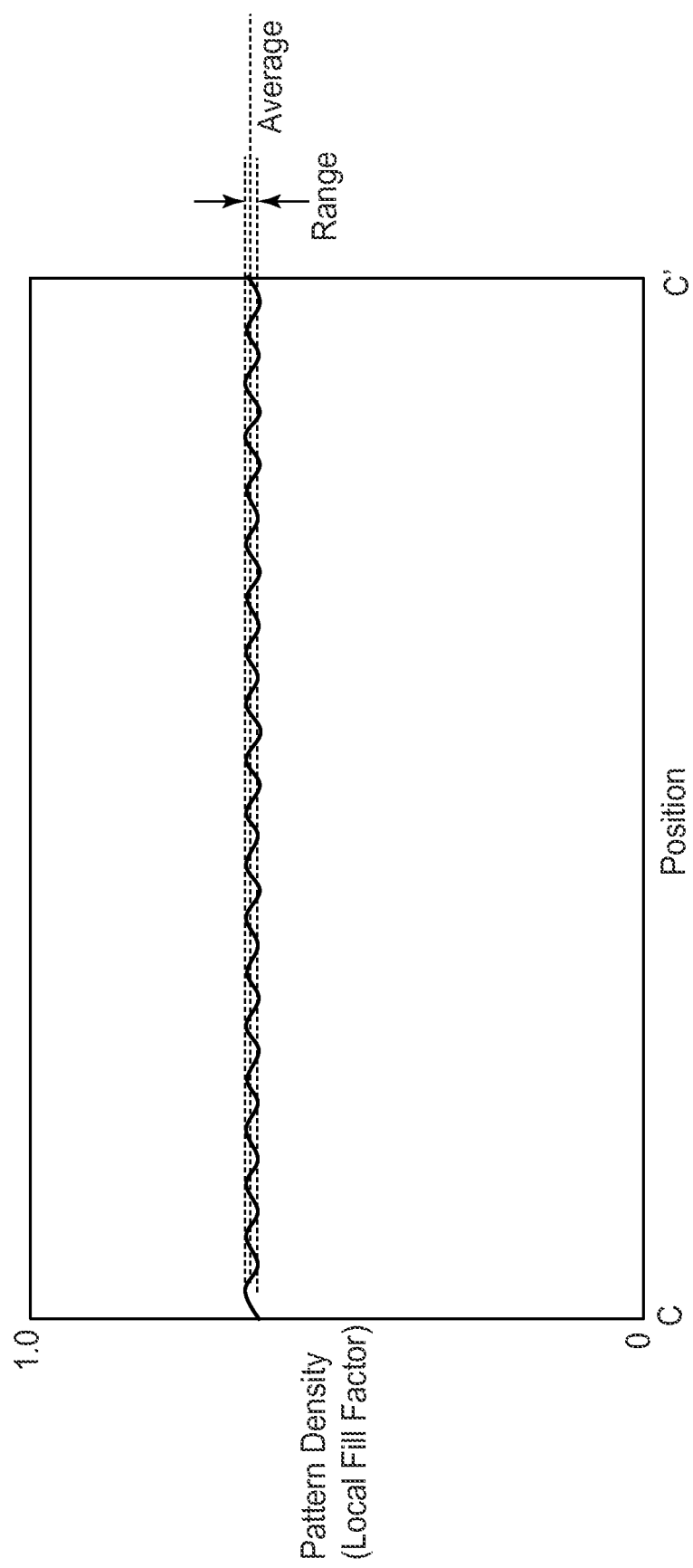
FIG. 7C is a plot of pattern density vs. position of along the CC' on the microcontact printing stamp of FIG. 7A.

A quantification of this variation of the designed (i.e., as exists on the stamping surface and the resulting printed substrate) pattern density or fill factor along the printing contact front propagation direction (i.e., the downweb direction, in the case of rotary roll-to-roll printing) has been found to be important for avoiding printing defects, a desirable result of using design concepts disclosed herein. The quantification used herein is based on calculating the local pattern density along the direction of stamp-substrate contact front propagation. The term "lane" is used herein to describe a pattern section of fixed width that is oriented along (i.e., parallel to) the contact front propagation direction. For printing in a rotary roll-to-roll process, the printing contact front propagation direction is the downweb direction of the process product roll. The quantification used herein includes partitioning the pattern along the printing contact front propagation direction within a lane (along (i.e., parallel to) the lane direction) and calculating the local pattern density (i.e., pattern fill factor) for those partitions within the lane. Preferably, the pattern fill factor values for adjacent partitions along the printing contact front propagation direction (within the lane and along the lane direction, especially for a lane that includes an arrangement of high density pattern elements, for example modified pattern elements) do not vary substantially. An example of the partitioning is to partition a lane into adjacent 5 millimeter wide bands along the contact front propagation direction A (e.g., bands for calculating pattern density are oriented orthogonal to the line CC'). In the foregoing example, 5 millimeter refers to the dimension of the bands along the lane direction. The dimension of the bands across the lane direction (i.e., the width of the lane) can be selected according to a particular design. FIG. 7A gives an example of a lane width selection according to a particular design, the lane and its width being indicated by $l_1$ in FIG. 7A, corresponding to the width of the array or arrangement of bond pads, the array being oriented in the intended printing contact front propagation direction A. Preferably, the pattern density for such a lane (e.g., comprising an arrangement of high density pattern elements, as described above) does not vary by more than 50 percent from the average pattern density for all such bands in the lane, within at least a portion of the pattern, more preferably not more than 25 percent, most preferably not more than 10 percent. Such variation may be taken as the "range" in FIG. 7C divided by the "average" in FIG. 7C. In preferred embodiments, for a similar analysis with 2.5 mm bands, the pattern density for any such bands does not vary by more than 50 percent from the average pattern density for all such bands within at least a portion of the pattern, more preferably not more than 25 percent, most preferably not more than 10 percent. In preferred embodiments, for a similar analysis with 1 mm bands, the pattern density for any such bands does not vary by more than 50 percent from the average pattern density for all such bands within at least a portion of the pattern, more preferably not more than 25 percent, most preferably not more than 10 percent. In more preferred embodiments, for a similar analysis with 0.5 mm bands, the pattern density for any such bands does not vary by more than 50 percent from the average pattern density for all such bands within at least a portion of the pattern, more preferably not more than 25 percent, most preferably not more than 10 percent. In more preferred embodiments, for a similar analysis with 0.25 mm bands, the pattern density for any such bands does not vary by more than 50 percent from the average pattern density for all such bands within at least a portion of the pattern, more preferably not more than 25 percent, most preferably not more than 10 percent.

In one example embodiment shown in FIG. 5A, the traction features on a portion of a microcontact stamp 300 include an array of solid crossed traction bars 305 on a base surface 302. The traction bars may have a wide variety of shapes, sizes, and the like. In another example embodiment shown in FIG. 5B, the traction features on a portion of a microcontact stamp 320 include an array of linear features 325 forming a mesh-like pattern on a base surface 322. In a given area of the base surface 322, the mesh-like pattern can include, for example, about 30% to about 70% of the linear features 325. As noted above, the fraction features of FIGS. 5A-5B can be located on the outer edge of a design and/or in the center of a design between denser printing elements to create a more consistent down web microprinting contact density on a roll-to-roll process.

The patterned SAM formed from the stamp configurations described herein can be used, for example, as a resist that protects regions the underlying substrate surface during a subsequent patterning step. For example, the patterned SAM can provide an etch mask. As an etch mask, the regions of the substrate surface (for example, the surface of a metal coating on a polymeric film substrate) that are covered with the SAM are protected against the chemical action of an etchant, while regions of the substrate surface that are not covered with the SAM are not protected, allowing selective removal of material (for example, metal from a polymeric film substrate) in the unprotected regions. Alternatively, the patterned SAM can provide a plating mask. As a plating mask, the regions of the substrate surface (for example, the surface of a catalytic metal coating on a polymeric film substrate) that are covered with the SAM are rendered non-catalytic for deposition of metal from an electroless plating bath, while regions of the substrate surface that are not covered with the SAM remain exposed and therefore retain their catalytic activity, allowing for the selective placement of electrolessly deposited metal in the unprotected regions. Methodologies for the application of patterned SAMs as masks in the patterning of other materials are known in the art (for example, in U.S. Pat. No. 5,512,131).

Microcontact printing can be used to produce patterns constructed of lines with line widths smaller than 10 microns that have high optical transmission and relatively high electrical conductivity over a large area. This small line width size, along with a low density of the lines, is enabled by very fine patterning of the microcontact printing stamp to produce materials suitable for use as, for example, a touch screen. An exemplary microcontact printing process to make a touch screen is as follows: (1) a transparent web material is coated with metal, (for example, silver or copper is sputter coated or plated onto glass or PET film); (2) a self-assembled mono-layer mask is stamped onto the plated substrate using a microcontact printing stamp; and, (3) metal coated on the substrate is removed by etching, except for the pattern under the mask.

The resulting touch screen sensor element includes a transparent substrate and a micropatterned conductor (typically metal) of specified pattern geometry to achieve high optical quality. In general, optical quality can be expressed in terms of visible light transmittance, haze, and conductor visibility, as determined observing the conductor as it assembled in the touch screen sensor with unaided eyes. The geometry of the micropatterned conductor can be defined with parameters such as, but not limited to, the width of the conductor traces (sometimes referred to as "lines") used for the micropattern, the density of the lines, and the uniformity of the density of the lines.

In a first embodiment for a touch screen sensor having good optical quality, the touch screen sensor includes a visible light transparent substrate; and an electrically conductive micropattern disposed on or in the visible light transparent substrate. The micropattern has low density mesh regions as described above. In another embodiment, the touch screen sensor has a haze value of less than 10%, preferably less than 5%, and visible light transmittance greater than 75%, preferably greater than 85%. In another embodiment, the conductor trace width of the touch screen sensor is less than about 6 micrometers and having a pitch of less than about 300 micrometers. In another embodiment, the conductor trace of the touch screen sensor has a thickness of less than about 500 nanometers. In another embodiment, the pitch is about 1 mm to 4 mm, with a conductor width less between 3 and 10 microns.

Figure 9:
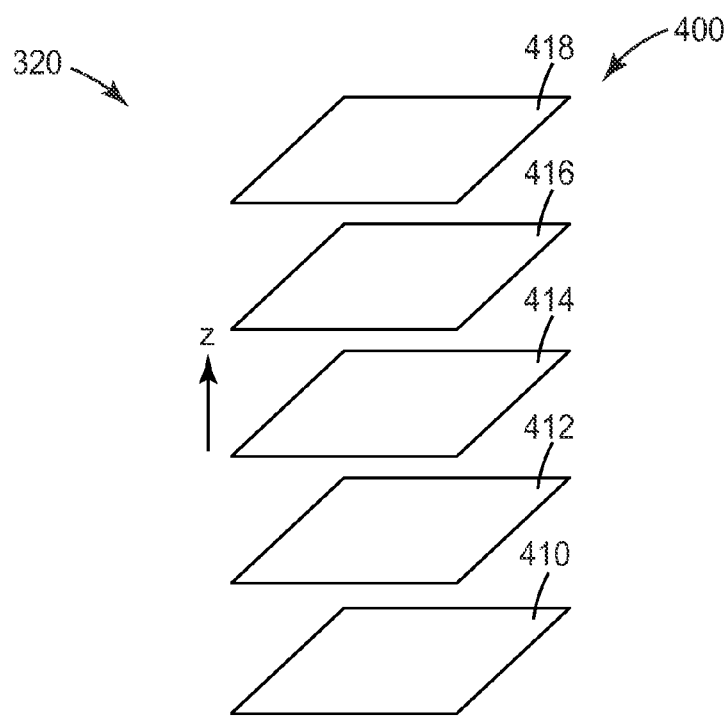
FIG. 9 is a schematic illustration of an arrangement of layers that can be laminated together to form one embodiment of the touch screen sensor, an X-Y grid type projected capacitive touch screen sensor.

A transparent sensor element 400 for a touch screen sensor is illustrated in FIG. 9. The sensor element 400 includes two patterned conductor layers 410, 414, (e.g., an X axis layer and a Y axis layer) two optically clear adhesive layers 412, 416, and a base plate 418, laminated together and depicted as separated in FIG. 6 for clarity. Layers 410 and 414 include transparent conductive mesh bars where one layer is oriented in the x axis direction and the other layer is orientated in the y axis direction. The base plate 418 is a sheet of glass, and a suitable optically clear adhesive is Optically Clear Laminating Adhesive 8141 from 3M Company, St. Paul, Minn.

For each of the X-layer and the Y-layer, a clear polymer film with a micropattern of metal is used. A micropattern of thin film gold is deposited onto a thin sheet of a polymeric web material, such as PET. A self-assembled mono-layer mask is stamped onto the plated substrate using a microcontact printing stamp such as those described above; and, (3) the metal coated on the substrate is removed by etching, except for the pattern under the mask.

Figure 10:
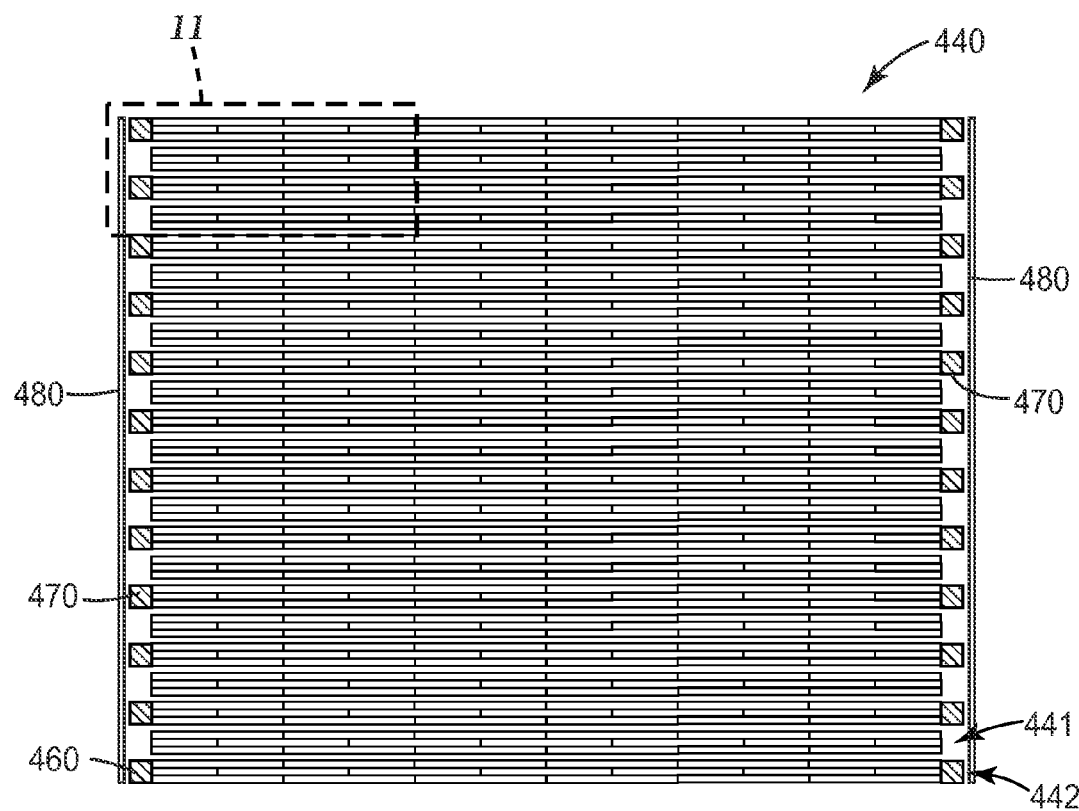
FIG. 10 illustrates a conductor micropattern for the X-layer or the Y-layer of an embodiment of the touch screen sensor according to FIG. 9.
Figure 11:
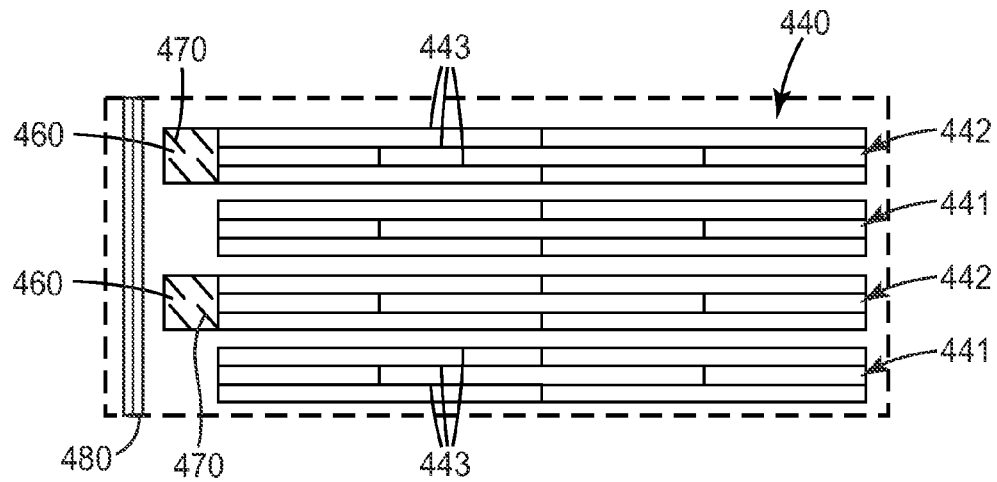
FIG. 11 is one embodiment of a portion of the conductor micropattern illustrated in FIG. 10, the portion including a first region of high optical quality conductive mesh contacting a second region including a contact pad with linear features.

The resulting metal micropattern 440 is depicted in FIGS. 10-11. The thickness of the gold on the web material is about 100 nanometers. A first region of the micropattern has a conductive region including a series of parallel mesh bars 442, and this first region has good optical quality and/or variable sheet resistance as defined above. The parallel mesh bars 442 that are terminated in a second region of the micropattern that includes square contact pads 460 suitable for forming an electrical connection to an electrical or electronic component. In one embodiment, the contact pads 460 are approximately 2 millimeters by 2 millimeters in area, and include a conductor in the form of thin film gold with a thickness of approximately 100 nanometers for connection to an electronic device for capacitive detection of finger touch to the base plate.

Figure 12:
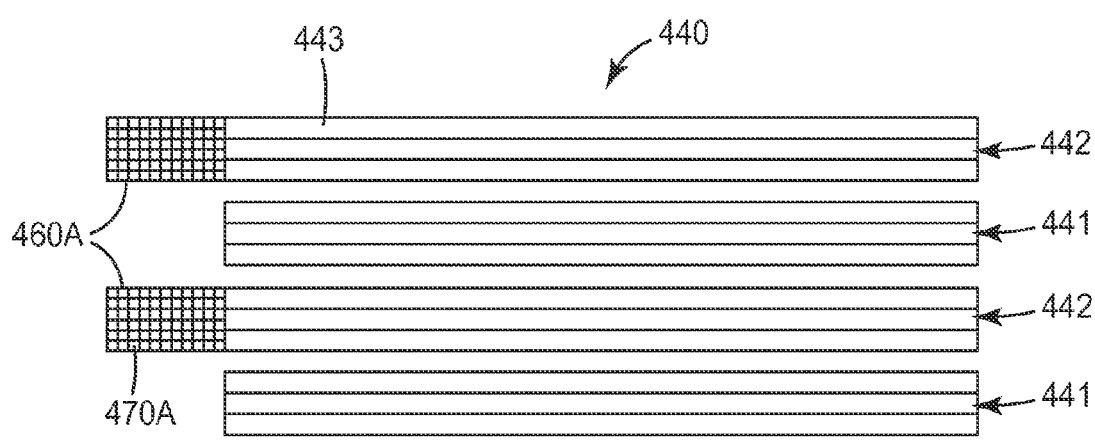
FIG. 12 is another embodiment of a portion of the conductor micropattern illustrated in FIG. 10, the portion including a first region of high optical quality conductive mesh contacting a second region including a contact pad with mesh features.

The square contact pads 460 include a continuous layer of a conductive material interrupted by nonconductive areas 470 that are substantially free of metal and correspond to the elongated concavities in the printing elements of the micro-contact printing pad used to form the micropattern 440 (see, for example, printing element 144A in FIG. 4A). In an alternative embodiment shown in FIG. 12, the contact pads 460A may include a mesh-like conductive pattern 470A with metal-free areas corresponding to the channels in the micro-contact printing pad (see, for example, the contact pad of FIG. 4B). Referring again to FIG. 11, the micropattern 440 may also optionally include patterns 480 along an edge, which correspond to the traction features included in the microcontact printing stamp used to form the micropattern (see, for example, the traction feature 325 in FIG. 8B)

An arrangement of mesh bars 441 is electrically isolated from the electronic square pads 460. The isolated mesh bars 441 maintain optical uniformity across the sensor. Each bar is made of a mesh made up of narrow metallic traces 443, the traces 443 measuring approximately 5 micrometers in width. This mesh design provides ties between long-axis traces in each mesh bar, to maintain electrical continuity along the mesh bar, in case of any open-circuit defects in the long axis traces.

In various embodiments, the contact pads 460 may be electrically connected to an electronic component such as, for example, a flexible circuit, using a conductive adhesive or a conductive transfer tape. Suitable conductive adhesives include, but are not limited to, the anisotropically conductive films available from 3M, St. Paul, Minn., under the trade designations 3M Anisotropically Conductive Film 5363, 7303, 7371, 7376, and 7379. These films include an adhesive matrix having therein with conductive particles. In some embodiments, the adhesive matrix is selected from an acrylate adhesive, an epoxy adhesive, a silicone adhesive, or a mixture or combination thereof. In various embodiments, the conductive particles include, but are not limited to, silver, gold, copper, aluminum and the like, and mixtures thereof, as well as other metals or nonconductive particles (for example, polymers) having a conductive coating made from, for example, silver, gold, copper, aluminum, and mixtures and combinations thereof. Examples of suitable conductive transfer tapes include, but are not limited to, those available from 3M, St. Paul, Minn., under the trade designations 3M Electrically Conductive Adhesive Transfer Tape 8703, 9703, 9704 and 9705. These Adhesive Transfer Tapes include acrylic pressure sensitive adhesive matrices loaded with silver particles, and may conduct through the adhesive matrix along the z direction.

Electrical traces on the flexible circuits can be used connect the touch screen assembly 400 to components of a display device such as a computer, mobile phone, tablet, and the like.

The presently claimed process will now be discussed in the following non-limiting examples.

EXAMPLES

Examples 1-7 (Thin, Elongated Pads)

An experimental set-up was prepared similar to that depicted in FIG. 1 of WO2013/003253, and further as described above. A web of indefinite length polyethylene terephthalate (PET), 8 inches (20.3 cm) wide and 0.005 inch (0.127 mm) thick, commercially available as ST504 film from DuPont of Wilmington, Del., which had been coated with a 100 nm layer of silver by conventional sputtering, was threaded up. The experimental set-up included a roll in the form of a thin shell of primarily nickel, 8.658 inches (21.906 cm) in diameter and 0.010 inch (0.254 mm) thick, commercially available as Nickel Sleeve from Stork Prints America of Charlotte, N.C.

The nickel shell was mounted around a non-rotating steel supporting core with a plurality of apertures serving as an air bearing. Air pressure of 40 inches of water (0.10 kg/cm2) was provided to the core to support the shell.

A micro-contact printing stamp was prepared from polydimethylsiloxane (PDMS) according to the description associated with FIGS. 1-11 in copending and coassigned publication WO2013/003412, "Method for Making, Inking, and Mounting Stamps for Micro-Contact Printing." The micro-contact printing stamp was then saturated with a 200 mmol solution of C16 thiol in ethanol. The micro-contact printing stamp was then adhered to the nickel shell by double-sided adhesive tape in a configuration according the description associated with FIGS. 16 and 17 in WO2013/003412. Application of the micro-contact printing stamp to the roll was accomplished using a carriage having an upper platen on which the stamp was supported. The upper platen could be raised and lowered for vertical Z translation by a low friction pneumatic cylinder positioned between the upper platen and the carriage. The carriage was moved along linear bearings in the X direction by an actuator. As the carriage was translated, the roll was rotated and the stamp was transferred to the roll and adhered with adhesive to the surface of the roll. This procedure is further described in WO2013/040319, "Method and Apparatus for Applying a Stamp for Microcontact Printing to a Stamping Roll." The stamp was prepared so as to print the image shown in FIG. 4B, so that each of the seven elongated patterns shown in the Figure would be printed simultaneously. These elongated patterns correspond with Examples 1 through 7, assigned left-to-right as FIG. 4B is oriented. These patterns were designed to replace solid interconnects or solid bond pads which had previously had difficulties with air entrainment at the line speed used in this experiment.

These Examples 1-7 were designed to explore solutions to that entrainment. The experimental set-up was adjusted so that the web was in contact with the micro-contact printing stamp for approximately 1-2% of the circumference of the thin shell roll. The web was then advanced at a line speed of 10 feet/minute (3.05 m/min) at a web tension of 1 pound per linear inch (1.75 N/linear cm). After the run, a solution of thiourea and ferric nitrate was used to etch the silver where the deposited PDMS had not protected it.

The selected designs for Examples 1-7 included both interior voids and elongated concavities, and were generally as depicted in FIG. 4B as described above. Interior voids or elongated concavities refer to the space left for the air and whether or not it was contained to the inside of the designed feature or allowed the air a path to exit the perimeter of the feature. The air bleed features that comprised parallel elongated interior voids or elongated concavities and air bleed features that comprised non-parallel elongated interior voids or elongated concavities were represented in the Examples 1-7. The bond pads of examples 1-7 (depicted from left to right in FIG. 4B), had open area fractions of 3%, 7.5%, 17.8%, 20%, 20%, 8%, 8%, respectively. Stated differently, the bond pads of examples 1-7 (depicted from left to right in FIG. 4B), had fill factors of 97%, 92.5%, 82.2%, 80%, 92%, and 92% respectively. While all the designs showed some decrease in voids or air entrapment compared with solid features of the same dimension, Examples 1 and 2 still had some instances of air entrainment, while examples 3-7 had none.

Experiments at more severe conditions oriented at an angle between 30 and 60 degrees to the web direction are particularly suitable. Air bleed features are conveniently can be 7 to 150 microns in width, preferably about 80 microns in width. The separation between the air bleed features can be 64 microns to 2000 mm, preferably between 100 and 600 microns.

Examples C8, 9-13

Electrical Assemblies Metal Patterned Substrates Bonded to Flexible Printed Circuits
Preparation of Metalized Polymer Film Substrates A polymer film substrate was provided, (polyethyleneterephthalate (PET), commercially available as ST504 from E. I. DuPont de Nemours and Company, Wilmington, Del., was sputter coated with titanium at average thickness of approximately 5 angstroms, forming a nonconductive layer. This coated substrate was then further sputter coated with silver at an average thickness of approximately 100 nanometers.
Stamp Fabrication Two different stamps were fabricated according to the following procedures. The stamps differed only according to their respective relief patterns. First and second planar master tools were fabricated using standard lithographic techniques, each having a unique relief pattern on one of its major surfaces. First and second elastomeric stamps were molded against the aforementioned major surface of each of the respective master tools by dispensing uncured polydimethylsiloxane (PDMS, Sylgard 184, Dow Corning, Midland, Mich.) against each master tool to a thickness of approximately 3.0 millimeters. The uncured silicone in contact with the master was cured for 2 days at room temperature. After peeling from each of the master tools, first and second PDMS stamps were provided with relief patterns comprising raised features approximately 1.8 micrometers in height.

The first master relief pattern of the first master tool included recessed features according to a first design, with the recessed features of the first master relief pattern corresponding to intended raised features of a first stamp that was molded against the first master relief pattern. The second master relief pattern of the second master tool included recessed features according to a second design, with the recessed features of the second master relief pattern corresponding to intended raised features of a second stamp that was molded against the first master relief pattern. Since in these Examples, the ink was used to protect the silver layer during etching, and thus create conductive silver patterns on the substrate, the raised features of each stamp in the discussion below may be described in terms of the silver features they ultimately created. In other words, a bond pad on the patterned substrate corresponds to a bond pad raised feature on a stamp that is used to pattern the substrate and to a bond pad recessed feature on the master tool that is used to mold the stamp. Similarly, an interconnect trace on the patterned substrate corresponds to an interconnect raised feature on a stamp that is used to pattern the substrate and to an interconnect recessed feature on the master tool that is used to mold the stamp. Finally, transparent conductive mesh elements on the patterned substrate correspond to raised mesh element features on a stamp that is used to pattern the substrate and to mesh recessed features on the master tool that is used to mold the stamp.

The first design included a one dimensional array (Array 1) solid bond pads, each bond pad having a width of 500 micrometers and the array having a pitch of 1000 micrometers (0% open area bond pads), with each bond pad being connected to an interconnect trace which was in turn connected to a transparent conductive mesh region comprising 2 micrometer wide traces and hexagonal mesh cells with width of approximately 200 micrometers (98.0% open area mesh).

The second design included four different one dimensional arrays (called Arrays 2-5 below) of mesh bond pads, each bond pad having a width of 500 micrometers and the array having a pitch of 1000 micrometers. Array 2 included mesh bond pads having square mesh geometry, 10 micrometer wide traces, and 30 micrometer pitch trace pitch (44.4% open area bond pads). Array 3 included mesh bond pads having square mesh geometry, 10 micrometer wide traces, and 40 micrometer pitch trace pitch (56.3% open area bond pads). Array 4 included mesh bond pads have a square mesh geometry, 5 micrometer wide traces, and 25 micrometer pitch trace pitch (64.0% open area bond pads). Array 5 included mesh bond pads have a square mesh geometry, 5 micrometer wide traces, and 35 micrometer pitch trace pitch (73.5% open area bond pads). The second design further included transparent conductive mesh regions comprising 2 micrometer wide traces and hexagonal mesh cells with width of approximately 200 micrometers (98.0% open area mesh).
Inking Each stamp was inked by contacting its relief patterned major to a 10 mM solution of octadecylthiol, commercially available as "ODT" 00005 from TCI AMERICA, Wellesley Hills, Mass., in ethanol for 16 hours. Each stamp was dried in air at room temperature for at least one hour before stamping.
Stamping The metalized polymer film substrates were stamped with inked stamps as described above. For stamping, the metalized film was contacted to the stamp relief patterned-surface, which was face up, by first contacting an edge of the film sample to the stamp surface and then rolling the film into contact across the stamp. The rolling step required less than 5 seconds to execute. After rolling step, the substrate was contacted with the stamp for approximately 10 seconds. Then, the substrate was peeled from the stamp, a step that required less than 1 second.
Etching After stamping, the metallized film substrate with printed pattern of octadecylthiol was contacted to an etchant solution for selective silver etching and metal patterning, yielding a metal patterned substrate. The etchant was an aqueous solution of thiourea (commercially available as T8656 from Sigma-Aldrich, St. Louis, Mo.) at a concentration of 30 mM and ferric nitrate (commercially available as 216828 from Sigma-Aldrich) at a concentration of 20 mM. To pattern the silver thin film, the printed metalized film substrate was contacted face down onto bubbling etchant, generally according to the procedure described in U.S. patent application Ser. No. 13/319,704. After etching, silver remained on the substrate in regions that were printed with octadecylthiol. The etching step removed the silver from regions that were not printed with octadecylthiol.

Bonding of Flexible Printed Circuit to Patterned Substrates

Flexible printed circuits (also referred to herein as FPC's, flexible tails, or flex tails) were bonded to the above described metal patterned substrates. The FPC's included patterned copper in the form of a one dimensional array of 0.5 millimeter wide bond pads and traces supported on 1 mil (0.025 mm) thick polyimide (obtained from Flexible Circuit Technologies, Plymouth, Minn.). The bond pads had a width of approximately 500 micrometers and the array had a pitch of approximately 1000 micrometers. The total width of the FPC was approximately 1 centimeter. Anisotropically conductive adhesive (also referred to herein as ACF, commercially available under the trade designation of 7303 from 3M Company, St. Paul, Minn.) was used for bonding (also referred to herein as ACF bonding) with a FPC adhered to each of the above described metal patterned substrates, creating an ACF bond. For each of Examples C8 and 9-13, the just described assembly of FPC, ACF, and metal patterned substrate was additionally heat bonded using a heat bonder commercially available as SIGNMARK CAT. NO. 86141 from DCI, Inc. Olathe, Kans. Each bond head was approximately 2 millimeters in width and 75 millimeters in length. The heat bonding was carried out with 120 Newtons of force and a bond temperature of 146° C. for 25 seconds. Four of the aforementioned 1 centimeter wide FPC's were bonded in each bonding cycle (i.e., 120 newtons of force was distributed across an area 2 millimeters by 4 centimeters (the width of the four FPC's).

Characterization of ACF Bonded FPC and Metal Patterned Substrate

For each of the assemblies of an FPC that was ACF bonded to a metal patterned substrate, the following characterization was carried out. A bond electrical resistance was measured for each bond using a multimeter (commercially available as Model 179 from Fluke Corp. of Everett, Wash.) by contacting its probes to one end of the FPC and the other end of the bond pad. Because the bond area across each electrical bond pad was approximately 0.5 millimeters by 2 millimeters (area of 1 square millimeter), the resistance readings reported below in ohms corresponds also to the bond electrical contact resistance per unit area expressed in ohms per square millimeter. Each bond was imaged using an optical microscope (commercially available as DM4000 from Leica Microsystems, Wetzlar, Del.). Finally, ACF bond strength was measured by a materials testing system commercially available as MTS Insight 30 EL from MTS Systems Corp. of Eden Prairie, Minn. The test was performed by peeling the FPC from the metal patterned substrate at 90 degree orientation and a strain rate of 50 millimeters per minute. The peak load was recorded for each assembly, in units of gram force (1 gram force=0.0098 Newtons). For example C8, two assemblies were measured for ACF bond strength. For examples 9-12, three assemblies were measured for ACF bond strength. For example 13, five assemblies were measured for ACF bond strength. Bond strength values reported below are average values for the aforementioned groups of assemblies. Because the total bond area for each FPC was approximately 1 centimeter wide (orthogonal to the peeling direction), the peak load values reported below in grams-force also correspond to the bond strength per unit bond length expressed in grams-force per centimeter.

Example C8

Figure 13:
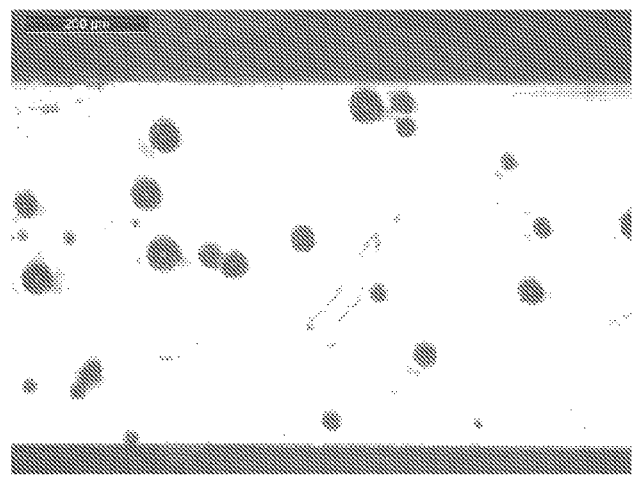
FIGS. 13-18 are optical photomicrographs of anisotropically conductive film (ACF) adhesive bonds made between flexible printed circuits and metal patterned substrates, including ACF bonding of FPC's to solid bond pads and ACF bonding of FPC's to modified pattern elements (bond pads).

An above described FPC was ACF bonded to the metal patterned substrate of the first design, with the array of FPC bond pads aligned to the Array 1 of solid bond pads (0% open area bond pads). FIG. 13 is an optical photomicrograph of the bond, showing the conductive particles of the ACF. The bond electrical resistance and ACF bond strength are given in Table 1. This Example is designated "C8" in consideration of it being a comparative; it has no elongated concavities or interior pattern voids.

Example 9

Figure 14:
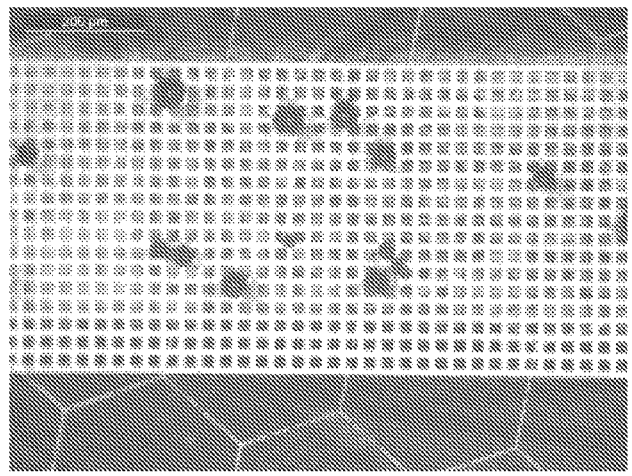

An above described FPC was ACF bonded to the metal patterned substrate of the first design, with the array of FPC bond pads aligned to the Array 2 of solid bond pads (44.4% open area mesh bond pads; square mesh of 10 micrometers traces with 30 micrometer pitch). FIG. 14 is an optical photomicrograph of the bond, showing the conductive particles of the ACF. The bond electrical resistance and ACF bond strength are given in Table 1.

Example 10

Figure 15:
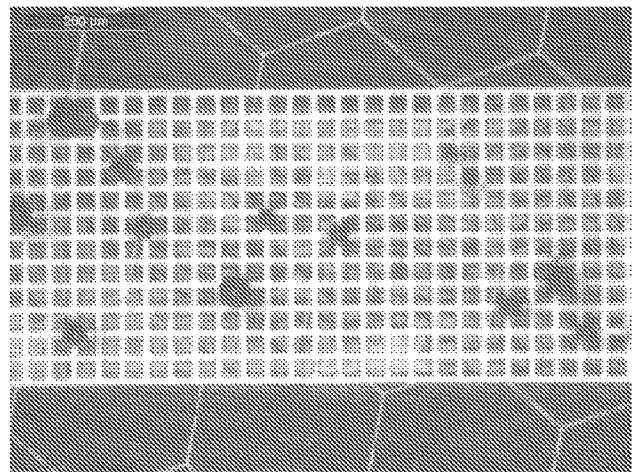

An above described FPC was ACF bonded to the metal patterned substrate of the first design, with the array of FPC bond pads aligned to the Array 3 of solid bond pads (56.3% open area mesh bond pads; square mesh of 10 micrometers traces with 40 micrometer pitch). FIG. 15 is an optical photomicrograph of the bond, showing the conductive particles of the ACF. The bond electrical resistance and ACF bond strength are given in Table 1.

Example 11

Figure 16:
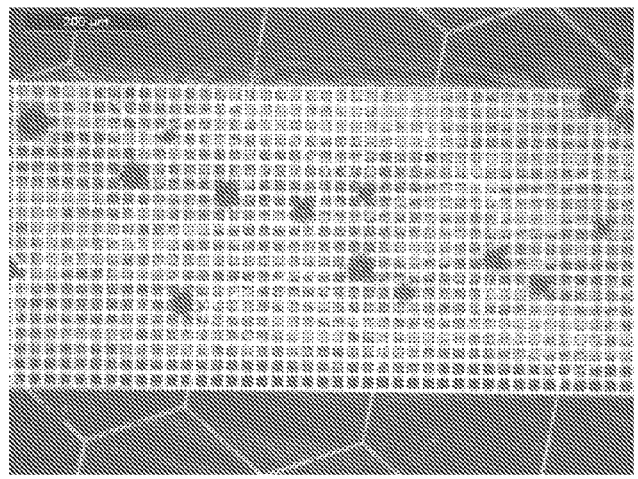

An above described FPC was ACF bonded to the metal patterned substrate of the first design, with the array of FPC bond pads aligned to the Array 4 of solid bond pads (64.0% open area mesh bond pads; square mesh of 5 micrometers traces with 25 micrometer pitch). FIG. 16 is an optical photomicrograph of the bond, showing the conductive particles of the ACF. The bond electrical resistance and ACF bond strength are given in Table 1.

Example 12

Figure 17:
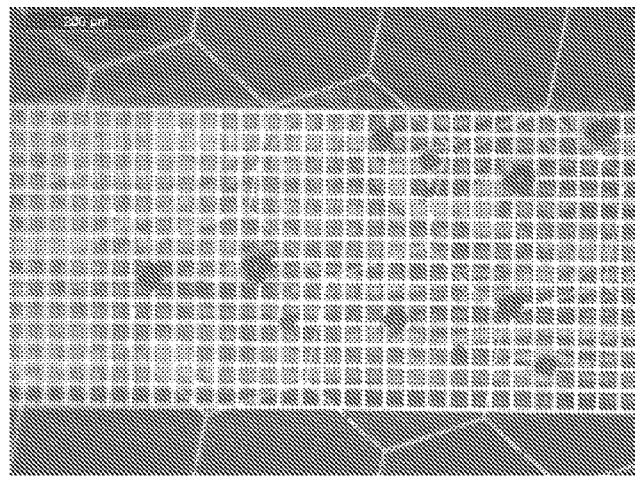

An above described FPC was ACF bonded to the metal patterned substrate of the first design, with the array of FPC bond pads aligned to the Array 5 of solid bond pads (73.5% open area mesh bond pads; square mesh of 5 micrometers traces with 35 micrometer pitch). FIG. 17 is an optical photomicrograph of the bond, showing the conductive particles of the ACF. The bond electrical resistance and ACF bond strength are given in Table 1.

Example 13

Figure 18:
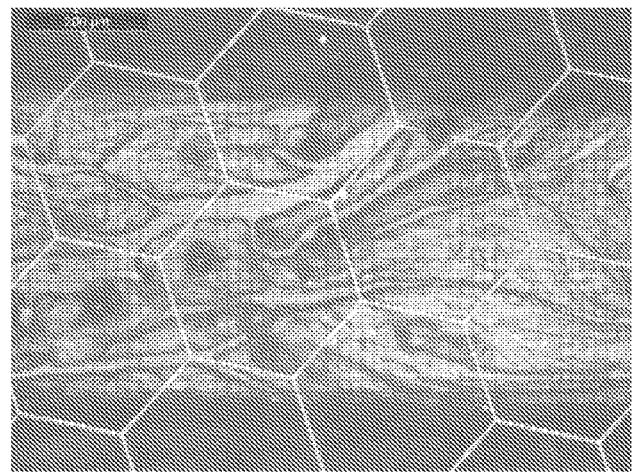

An above described FPC was ACF bonded to the metal patterned substrate of an hexagonal mesh (2 micrometer traces and 300 micrometer cell size) of the second design, with the array of FPC bond pads aligned to the transparent conductive mesh region (98.7% open area mesh). FIG. 18 is an optical photomicrograph of the bond, showing the conductive particles of the ACF. The bond electrical resistance and ACF bond strength are given in Table 1.

TABLE 1

| Example No. | Bond Pad Geometry | Open Area | Fill Factor | Bond Pad Mesh Trace Width (micrometers) | Bond Pad Mesh Pitch (micrometers) | Bond Pad Mesh Trace Spacing (micrometers) | Bond Electrical Resistance (ohms) | Peak Load (grams force) |
|---|---|---|---|---|---|---|---|---|
| C8 | Solid | 0% | 100% | N/A | N/A | N/A | 0.8 | 481 |
| 9 | Square Mesh | 44.4% | 55.6% | 10 | 30 | 20 | 2.8 | 1120 |
| 10 | Square Mesh | 56.3% | 43.7% | 10 | 40 | 30 | 4.4 | 1254 |
| 11 | Square Mesh | 64.0% | 36.0% | 5 | 25 | 20 | 6.2 | 901 |
| 12 | Square Mesh | 73.5% | 26.5% | 5 | 35 | 30 | 8.2 | 1110 |
| 13 | Hexagonal Mesh | 98.7% | 1.3% | 2 | 300 | 198 | 74.4 | 1126 |

Various embodiments of the invention have been described. These and other embodiments are within the scope of the following claims.

The invention claimed is:

1. A method comprising:
   providing an elastomeric stamp comprising a base surface and a stamping surface extending away from the base surface, the stamping surface comprising at least one first pattern element and at least one second pattern element, and wherein:
      the first pattern element of the stamping surface has a fill factor of 20 to 99 percent, and the first pattern element of the stamping surface comprises a continuous region and at least one discontinuous region comprising at least one of: (1) one or more elongated concavities, and (2) one or more interior voids; and
      the second pattern element of the stamping surface has a fill factor of 0.25 to 10 percent, and the second pattern element of the stamping surface comprises traces with a width from 0.1 micrometers to 50 micrometers;
   inking the stamping surface with an ink composition comprising a functionalizing molecule with a functional group selected to bind to a major surface of an ink-receptive material selected from a sheet or a web; and
   contacting the inked stamping surface with the major surface of the ink-receptive material for a contact time sufficient to bind the functional group with the major surface of the ink-receptive material to form a self-assembled monolayer (SAM) of the functionalizing material thereon.

2. The method of claim 1, wherein the interior voids in first pattern element in the first stamping surface form a mesh.

3. The method of claim 1, wherein the elongated concavities in the first pattern element are oriented at an angle with respect to a direction of movement of a contact front between the stamp and the major surface of the web of ink-receptive material.

4. The method of claim 3, wherein the angle is 30° to 60°.

5. The method of claim 1, wherein the elongated concavities or the interior voids form an X-shaped pattern.

6. The method of claim 1, wherein the fill factor of the first pattern element is 22.5%-95%.

7. An elastomeric microcontact printing stamp comprising a base surface and a stamping surface extending away from the base surface, the stamping surface comprising:
   at least one first pattern element with a fill factor of 20 to 99 percent, wherein the first pattern element of the stamping surface comprises a continuous region and at least one discontinuous region comprising at least one of: (1) one or more elongated concavities, and (2) one or more interior voids; and
   at least one second pattern element having a fill factor of 0.25 to 10 percent, and wherein the second pattern element of the stamping surface comprises a plurality of traces, wherein each trace has a width from 0.1 micrometers to 50 micrometers;
   wherein the stamping surface has disposed thereon an ink comprising a plurality of functionalizing molecules comprising at least one functional group selected to bind to a substrate and form a self-assembled monolayer (SAM) of the functionalizing molecules on the substrate.

8. The stamp of claim 7, wherein the stamping surface comprises one or more elongated concavities in the first pattern element, and wherein each elongated concavity has an aspect ratio of 2 to 100, optionally wherein each elongated concavity has an aspect ratio of 5 to 50.

9. The stamp of claim 7, wherein the stamping surface comprises one or more interior voids in the first pattern element, and wherein the interior voids are elongate or branched.

10. An electrically conductive pattern disposed on a visible light transparent substrate, the pattern comprising:
   at least one first pattern element comprising a fill factor of 20 to 99 percent, wherein the first pattern element comprises a continuous region and at least one discontinuous region, wherein the discontinuous region comprises at least one of: (1) one or more elongated concavities, and (2) one or more interior voids; and at least one second pattern element electrically connected to the first pattern element, wherein the second pattern element has a fill factor of 0.25 to 10 percent, and wherein the second pattern element further comprises traces, and wherein each trace has width from 0.1 micrometers to 50 micrometers.

11. The electrically conductive pattern of claim 10, wherein the stamping surface comprises one or more elongated concavities in the first pattern element, and wherein each elongated concavity has an aspect ratio of 2 to 100, optionally wherein each elongated concavity has an aspect ratio of 5 to 50.

12. The electrically conductive pattern of claim 10, wherein the stamping surface comprises one or more interior voids in the first pattern element, and wherein the interior voids are elongate or branched.

13. The electrically conductive pattern of claim 10, wherein the first pattern element in the stamping surface comprises both elongated concavities and interior voids.

14. The electrically conductive pattern of claim 10, wherein the interior voids in the first pattern element in the first stamping surface form a mesh.

15. The electrically conductive pattern of claim 10, wherein the fill factor of the first pattern element is 22.5%-95%, or the first pattern element has an area of 1 $mm^2$ to 10 $mm^2$.

16. The electrically conductive pattern of claim 10, wherein the second pattern element has a fill factor of 0.5% to 5%, or the second pattern element has an area of 10 $cm^2$ to 5000 $cm^2$.

17. The electrically conductive pattern of claim 10, wherein the second pattern element comprises a mesh, optionally wherein the mesh comprises a plurality of traces, and wherein each trace has a width of 0.5 micrometers to 10 micrometers.

18. The electrically conductive pattern of claim 10, wherein the conductive pattern is electrically connected to a second substrate at the first pattern element.

19. A touch screen sensor comprising a visible light transparent substrate having disposed thereon the electrically conductive pattern of claim 10.

20. A method comprising:
tensioning a web material between two support rollers at a tension up to about 10 pounds per lineal inch;
mounting a poly(dimethylsiloxane) stamp on a surface of a roller supported by an air bearing, wherein the stamp comprises a base surface and a stamping surface extending away from the base surface, the stamping surface comprising an arrangement of pattern elements, the pattern elements comprising:
at least one first pattern element with a fill factor of 20 to 99 percent, wherein the first pattern element comprises a continuous region and at least one discontinuous region, the discontinuous region comprising at least one of: (1) one or more elongated concavities; and (2) one or more interior voids; and
at least one second pattern element contiguous with the first pattern element, wherein the second pattern element has a fill factor of 0.25 to 10 percent, wherein the second pattern element comprises a plurality of elongated traces, and wherein each trace has a width of 0.1 micrometers to 50 micrometers;
inking the stamping surface with an ink composition comprising an organosulfur compound;
contacting the inked stamping surface with a major surface of the web material for a contact time sufficient for a thiol functional group on the organosulfur compound to bind to an ink-receptive surface of the web material to provide a self-assembled monolayer (SAM) of the organosulfur compound thereon according to the arrangement of pattern elements on the stamping surface; and removing the stamping surface from the major surface of the web material.

* * * * *

UNITED STATES PATENT AND TRADEMARK OFFICE
CERTIFICATE OF CORRECTION

PATENT NO. : 9,873,276 B2
APPLICATION NO. : 15/033672
DATED : January 23, 2018
INVENTOR(S) : Catherine Tarnowski Page 1 of 1

It is certified that error appears in the above-identified patent and that said Letters Patent is hereby corrected as shown below:

In the Specification

Column 10
Line 6, Delete "X=—CH3," and insert -- X=—CH3, --, therefor.
Line 7, Delete "X=—CH3." and insert -- X=—CH3. --, therefor.

Column 14
Line 2, Delete "concavitites" and insert -- concavities --, therefor.

Column 15
Line 11, Delete "concavitites" and insert -- concavities --, therefor.

Column 23
Line 43, Delete "fraction" and insert -- traction --, therefor.

Figure 8A:
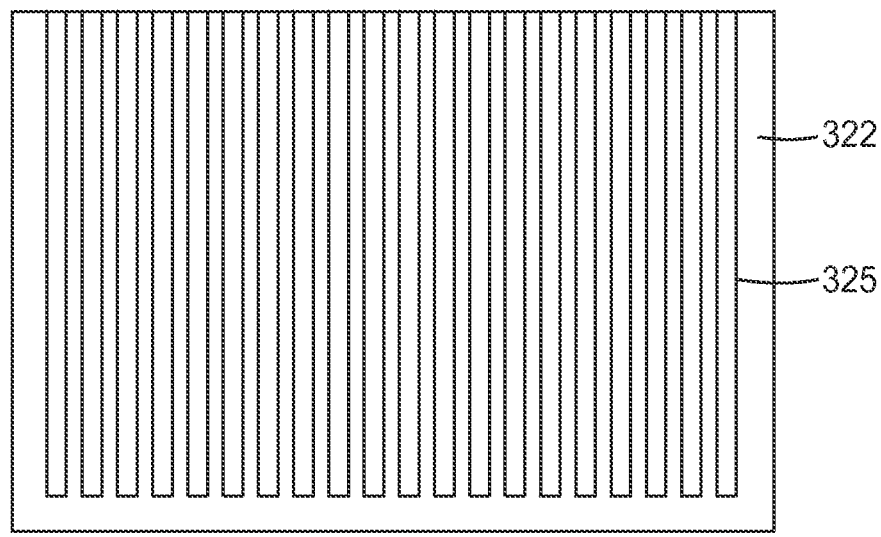
FIGS. 8A-8B are schematic overhead views of arrays of traction features on a portion of a microcontact printing stamp.
Figure 8B:
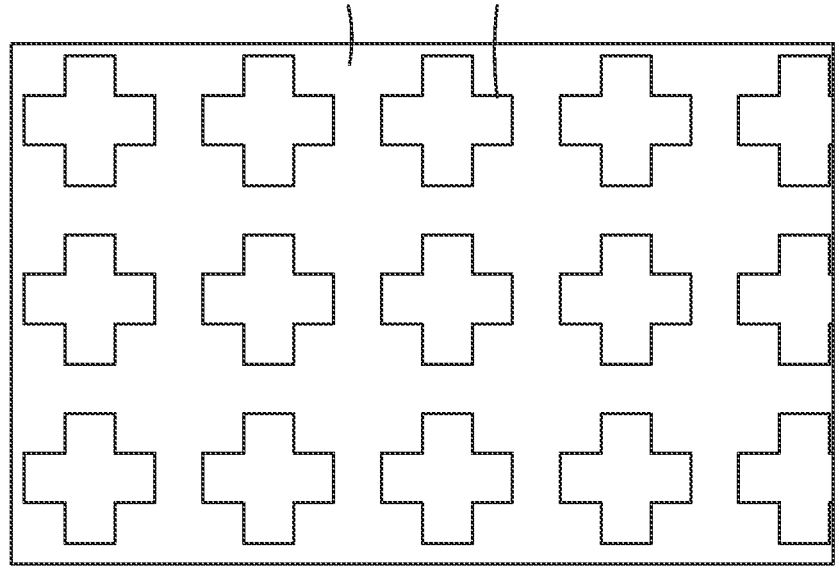

Column 25
Line 33, After "FIG. 8B)" insert -- . --.

Signed and Sealed this
Thirty-first Day of July, 2018

Andrei Iancu
*Director of the United States Patent and Trademark Office*